US008285351B2

(12) United States Patent
Johnson et al.

(10) Patent No.: US 8,285,351 B2
(45) Date of Patent: Oct. 9, 2012

(54) HIGH-$T_c$ SUPERCONDUCTIVITY OF ELECTRON-DOPED WATER-CLUSTER CLATHRATES

(75) Inventors: Keith Johnson, Cambridge, MA (US); Matthew Price-Gallagher, Montreal (CA)

(73) Assignee: HydroElectron Ventures, Inc., Westmount (CA)

( * ) Notice: Subject to any disclaimer, the term of this patent is extended or adjusted under 35 U.S.C. 154(b) by 0 days.

(21) Appl. No.: 13/141,522

(22) PCT Filed: Dec. 29, 2009

(86) PCT No.: PCT/US2009/069749
§ 371 (c)(1),
(2), (4) Date: Aug. 25, 2011

(87) PCT Pub. No.: WO2010/123533
PCT Pub. Date: Oct. 28, 2010

(65) Prior Publication Data
US 2011/0301039 A1   Dec. 8, 2011

Related U.S. Application Data

(60) Provisional application No. 61/141,062, filed on Dec. 29, 2008, provisional application No. 61/161,927, filed on Mar. 20, 2009.

(51) Int. Cl.
*H01L 39/24* (2006.01)
(52) U.S. Cl. ........................................................ 505/230
(58) Field of Classification Search .................. 505/100, 505/230; 423/580; 977/723
See application file for complete search history.

(56) References Cited

U.S. PATENT DOCUMENTS 4,686,833 A * 8/1987 Hino et al. ........................ 62/68
5,324,436 A * 6/1994 John et al. ..................... 210/638
5,997,590 A * 12/1999 Johnson et al. ................. 44/301

* cited by examiner

*Primary Examiner* — Colleen Dunn
(74) *Attorney, Agent, or Firm* — Choate Hall & Stewart LLP; Brenda Herschbach Jarrell; Jeffrey E. Buchholz

(57) ABSTRACT

Preparation and deposition of supercooled, electron-doped, water-cluster clathrate nanoparticles in confined geometries and on substrates from proprietary nanoemulsions is described. The compositions can yield high-$T_c$ superconductors, e.g., in the vicinity of −43 deg C., useful for SQUID devices in electronic and magnetic application. In certain embodiments, the water-cluster clathrates are formed in nanoemulsions.

14 Claims, 24 Drawing Sheets

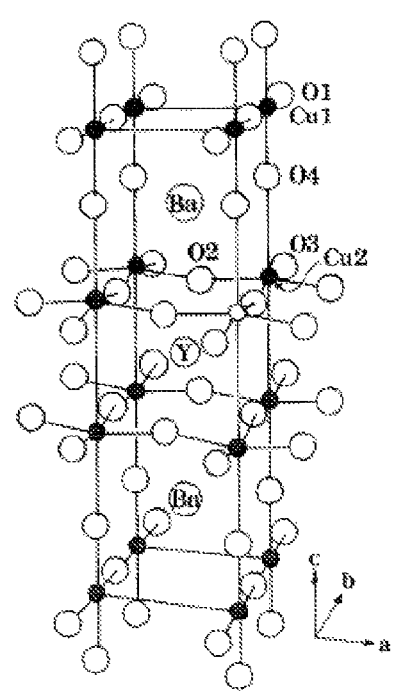
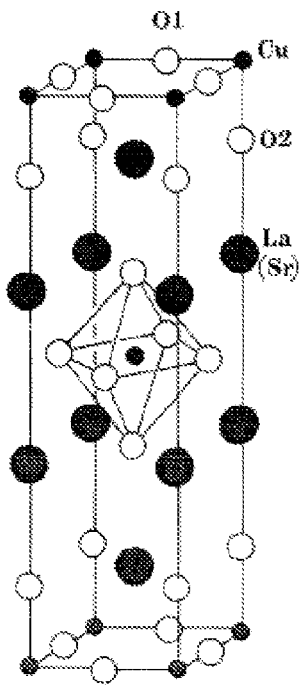
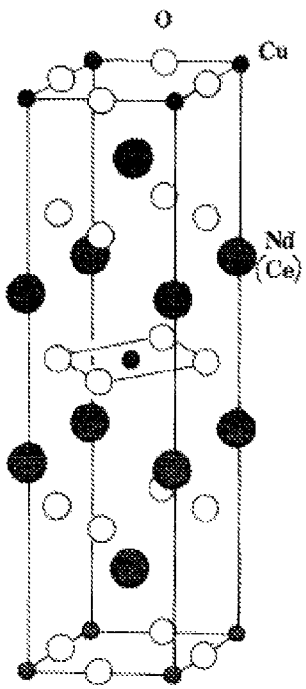
YBa$_2$Cu$_3$O$_7$　　　　La$_{2-x}$Sr$_x$CuO$_4$　　　　Nd$_{2-x}$Ce$_x$CuO$_4$
*FIG. 1A*　　　　*FIG. 1B*　　　　*FIG. 1C*

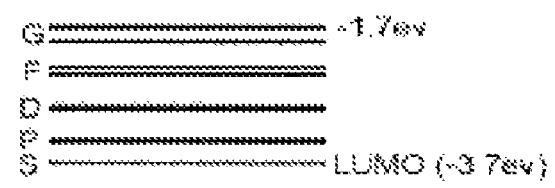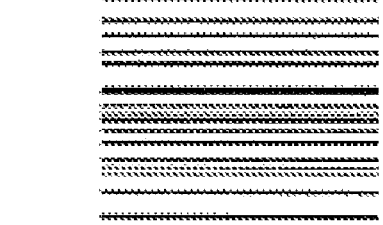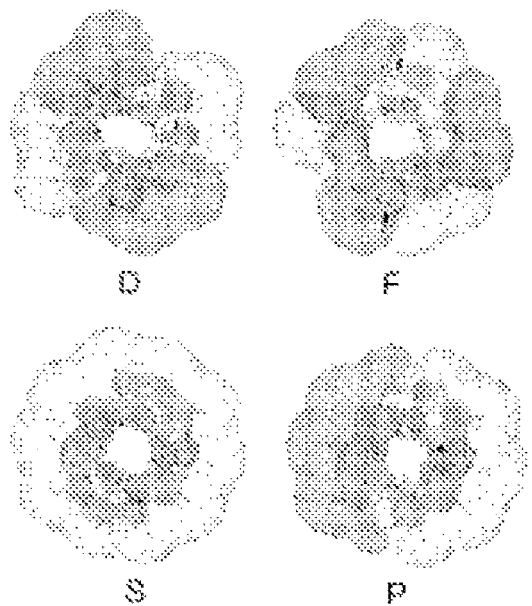
*FIG. 14*

HIGH-$T_c$ SUPERCONDUCTIVITY OF ELECTRON-DOPED WATER-CLUSTER CLATHRATES

CROSS-REFERENCE TO RELATED U.S. APPLICATIONS

The present application claims priority to U.S. provisional application No. 61/141,062 filed on Dec. 29, 2008 and to U.S. provisional application 61/161,927 filed on Mar. 20, 2009, all of which are incorporated herein by reference.

FIELD OF THE INVENTION

The present invention is directed to high-$T_c$ superconducting compositions of matter comprising water-cluster clathrates.

BACKGROUND

A major goal of superconductor research and development has been the discovery of useful substances that superconduct at the highest possible transition or critical temperatures $T_c$. Superconductivity can provide lossless flow of electrical current in a superconducting material as well as other beneficial physical characteristics.

The Bardeen-Cooper-Schrieffer (BCS) theory of superconductivity [see J. Bardeen, L. N. Cooper and J. R. Schrieffer, Phys. Rev., 108 (1957) 1175] ascribes the onset of the superconducting state of a crystal at the transition temperature $T_c$ to electrons attractively paired via virtual phonons of the lattice. The BCS formula for $T_c$ is:

$$T_c = \Theta_D \exp\left(-\frac{1}{N(0) \times V}\right) \quad \text{(Eq. 1)}$$

where $\Theta_D$ is the lattice Debye temperature, V is the attractive potential between electrons in Cooper pairs [see L. N. Cooper, Phys. Rev., 104 (1956) 1189] induced by the electron-phonon interactions, and N(0) is the electronic density of states for one spin at the Fermi energy.

The BCS theory together with its strong-coupling extension has been eminently successful in accounting for the physical properties, e.g., non-dissipative current, diamagnetism, and thermodynamics of the superconducting state of high-dimensional metals, and it has correlated many experimental data in terms of a few basic parameters. Nevertheless, it has often been emphasized that the BCS theory and formal extensions thereof do not satisfactorily explain the observed dependence of superconductivity on crystal structure and chemistry (especially for transition metals, alloys, and compounds) and are not very useful for predicting which materials should be superconducting and which should not. [See B. T. Matthias, Phys. Rev., 97 (1955) 74; in C. J. Gorter (ed.), Progress in Low Temperature Physics, Vol. II, North-Holland, Amsterdam, 1957, p. 138; in W. D. Gregory, W. N. Matthews, Jr. and E. A. Edelsack (eds.), The Science and Technology of Superconductivity, Vol. 1, Plenum, New York, 1973, p. 263; Physica, 55 (1971) 69.] Moreover, the BCS theory has failed to explain the origin and properties of high-$T_c$ superconductivity in low-dimensional (e.g. "layered") materials such as the cuprates [see J. G. Bednorz and K. A. Muller, Z. Phys. B64 (1986) 189] and recently discovered LaOFeAs superconductors [see Y. Kamihara et al., J Am. Chem. Soc. 130 (2008) 3296].

The existence of such high-$T_c$ superconducting materials, having short "coherence lengths", and those possessing only short-range structural order, such as superconducting amorphous alloys [see W. L. Johnson, S. J. Poon and P. Duwez, Phys. Rev., B11 (1975) 150] and super-conducting metal particles down to 50 Angstroms (Å) in size [see S. Matsuo, H. Sugiura and S, Noguchi, J Low-Temp. Phys., 15 (1974) 481; and K. Ohshima, T. Kuroshi and T. Fujita, J Phys. Soc. Jpn., 41 (1976)1234], would appear to be more conveniently viewed from a local "real-space" chemical approach, than by traditional concepts of long-range crystalline order and momentum (k) space, which lead to coherence lengths of the superconducting state that usually exceed the short-range order and electron mean free path characteristic of such superconductors. This emphasizes the desirability of having a local chemical-bonding or real-space molecular description of the superconducting state in order to complement BCS theory. Indeed, London [see F. London and H. London, Proc. R. Soc. London, Ser. A, 149 (1935) 71; Physica, 2 (1935) 341; F. London, Proc. R. Soc. London, Ser. A, 152 (1935) 24; and F. London, Superfluids, Vol. 1, Wiley, New York, 1950] in his phenomenological approach to superconductivity discusses the possibility of developing a molecular description of the superconducting state (see Chapter E of London's Superfluids), and Slater [see J. C. Slater, Phys. Rev., 51 (1937) 195; 52 (1937) 214] in an early attempt at describing superconductivity discusses the nature of the spatial character of the superconducting-state wave function. With speculations that mechanisms other than electron-phonon coupling can attractively pair electrons in the superconducting state [see W. A. Little, Phys. Rev., 134 (1964) A1416; H. Gutfreund and W. A. Little, in J. T. Devreese, R. P. Evrard and V. E. Van Doren (eds.), Highly Conducting One-Dimensional Solids, Plenum, New York, 1979, p. 305], a molecular criterion that accounts for the known chemical trends in the occurrence of superconductivity would be a useful tool in the ongoing effort to identify novel superconductors.

SUMMARY

Various embodiments of compositions of matter comprising water-cluster clathrates are described which can yield superconductivity at high transition temperatures (high-$T_c$ superconductivity). In certain embodiments, the water-cluster clathrates are formed in emulsions, e.g., nanoemulsions. The compositions can be deposited on a substrate and supercooled to provide superconducting characteristics. In some embodiments, the water clusters are electron doped, and in certain embodiments, the water clusters are provided in confined geometries. The high-$T_c$ superconducting compositions can be used for various applications and apparatuses in electronic or magnetic systems.

In various embodiments, apparatuses are described having an inventive composition comprising water clusters disposed on an insulating surface, wherein the water clusters are cooled to a temperature such that the composition is superconducting. The composition can be provided from a water-in-oil nanoemulsion, and the composition can be cooled to a temperature between about −23 deg C. and about −63 deg C. In some embodiments, the composition is cooled to about −43 deg C. The composition can also be supercooled to yield the superconducting water clusters. In some embodiments, the water clusters of the composition are confined in nanotubes. In certain embodiments, the water clusters disposed on an insulating surface are incorporated in a superconducting quantum interference detector (SQUID).

The foregoing and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the invention may be shown exaggerated or enlarged to facilitate an understanding of the invention. In the drawings, like reference characters generally refer to like features, functionally similar and/or structurally similar elements throughout the various figures. The drawings are not necessarily to scale, emphasis instead being placed upon illustrating the principles of the teachings. The drawings are not intended to limit the scope of the present teachings in any way.

FIGS. 1A-C represents crystal structures of cuprate superconductors.

FIG. 14 shows the computed density-functional molecular-orbital energies of a pentagonal dodecahedral water cluster (FIG. 12A). The lowest unoccupied "S", "P", "D", and "F" molecular orbitals (LUMOs) are spread around and radially extended away from the cluster "surface" oxygen atoms.

The features and advantages of the present invention will become more apparent from the detailed description set forth below when taken in conjunction with the drawings.

DETAILED DESCRIPTION

Various embodiments of compositions of matter are described which can yield high-$T_c$ superconductivity. In overview, the compositions comprise water clusters and are supercooled to yield superconducting characteristics. In some embodiments, the compositions comprise a nanoemulsion having stabilized water clusters therein. In certain embodiments, the water clusters are provided in confined geometries.

Figure 2:
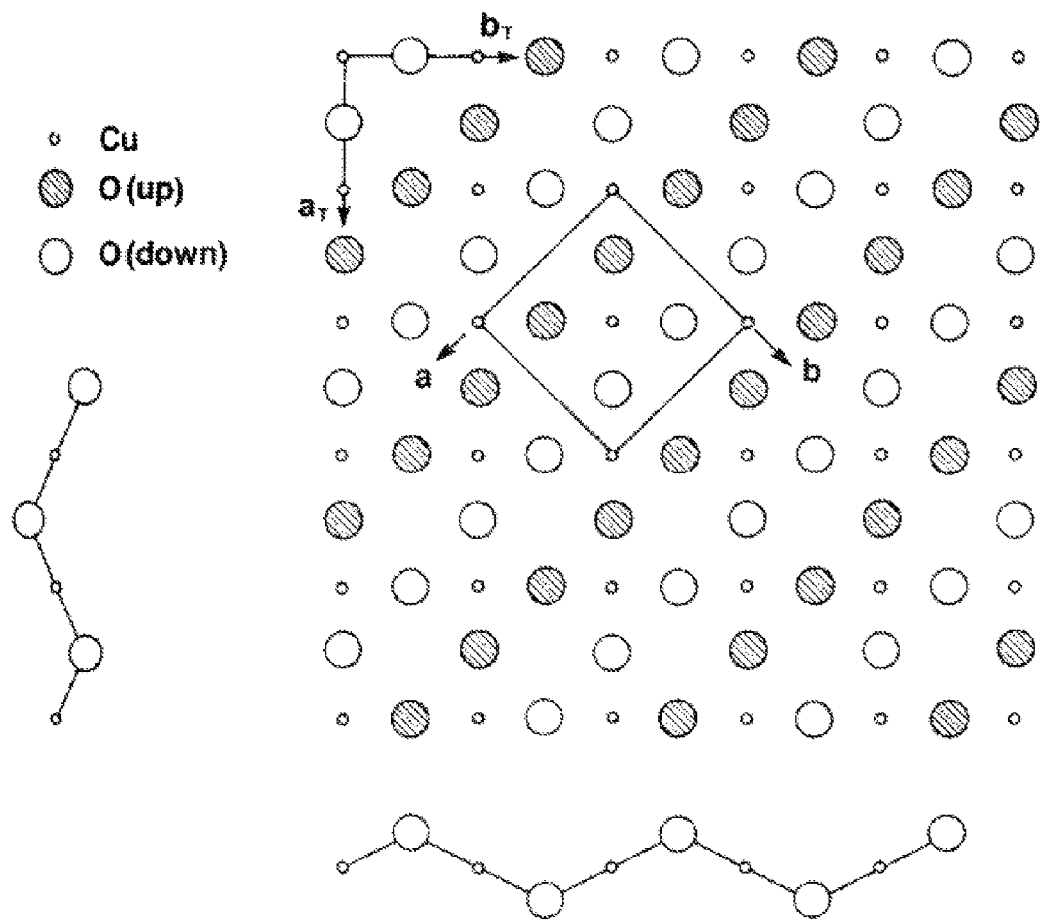
FIG. 2 illustrates the layer structure of the cuprate superconductors.
Figure 3:
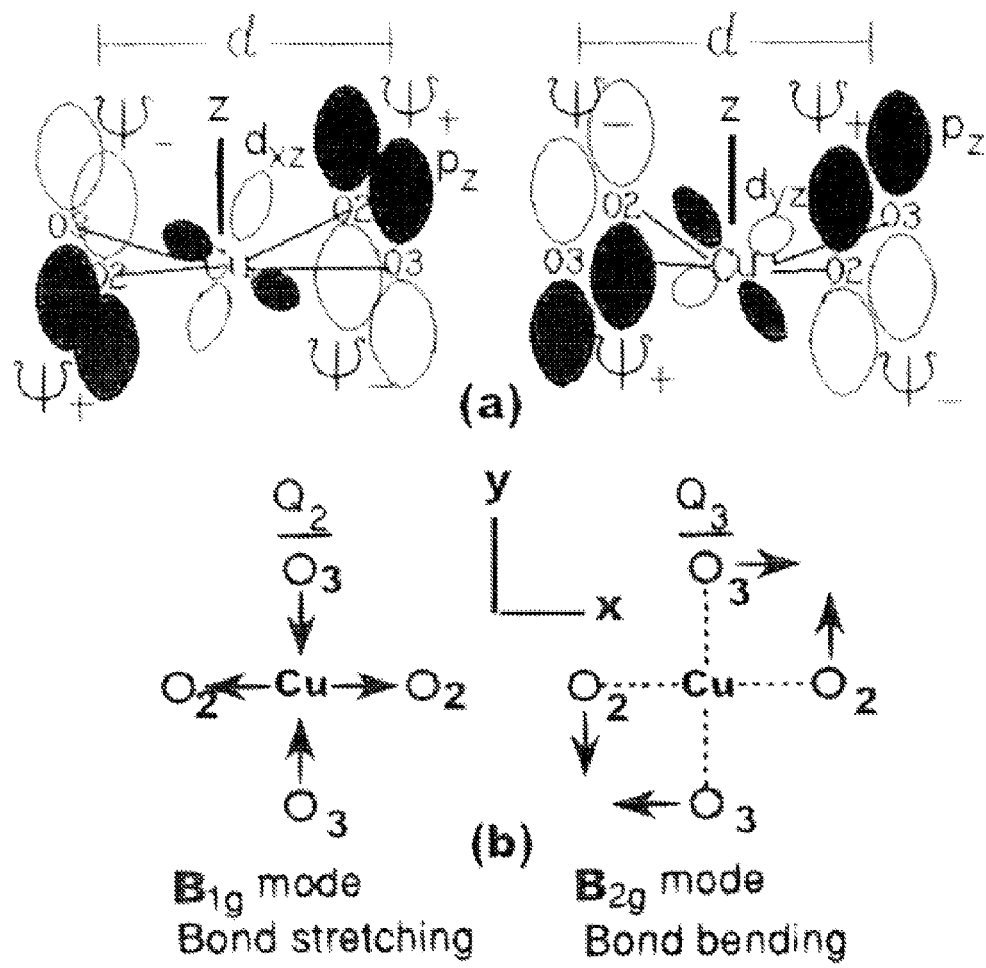
FIG. 3A depicts the degenerate molecular orbitals at the Fermi energy that undergo electron pairing in cuprate high-$T_c$ superconductors.
FIG. 3B depicts the Dynamic-Jahn-Teller-induced vibrational modes inducing electron pairing of these orbitals.
Figure 4:
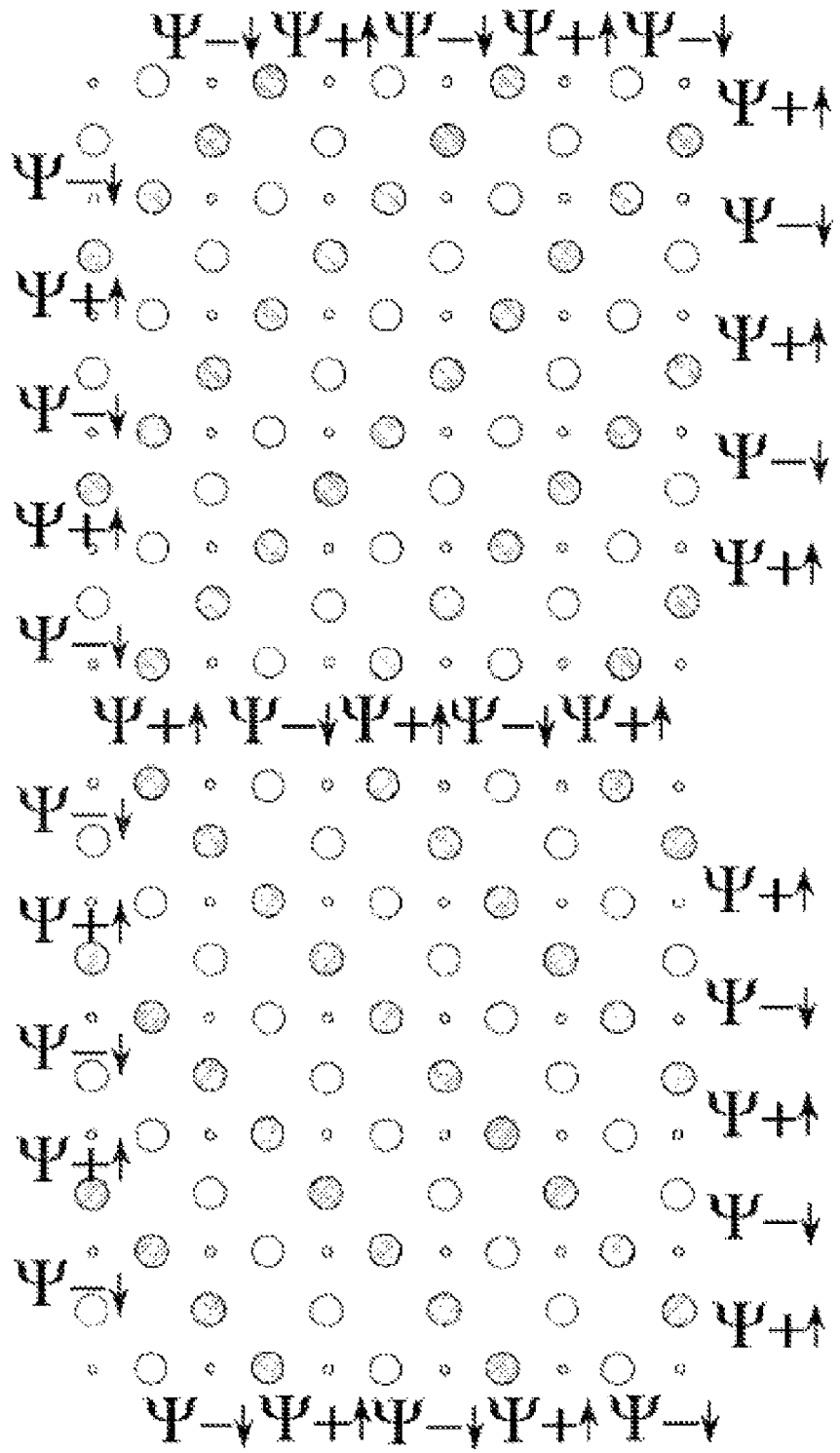
FIG. 4 illustrates the coherent molecular orbitals of overlapping pπ atomic orbitals of opposite-phase and spin, $\Psi_+$ and $\omega_-$ at the Fermi energy for the high-$T_c$ cuprate superconductors.
Figure 5:
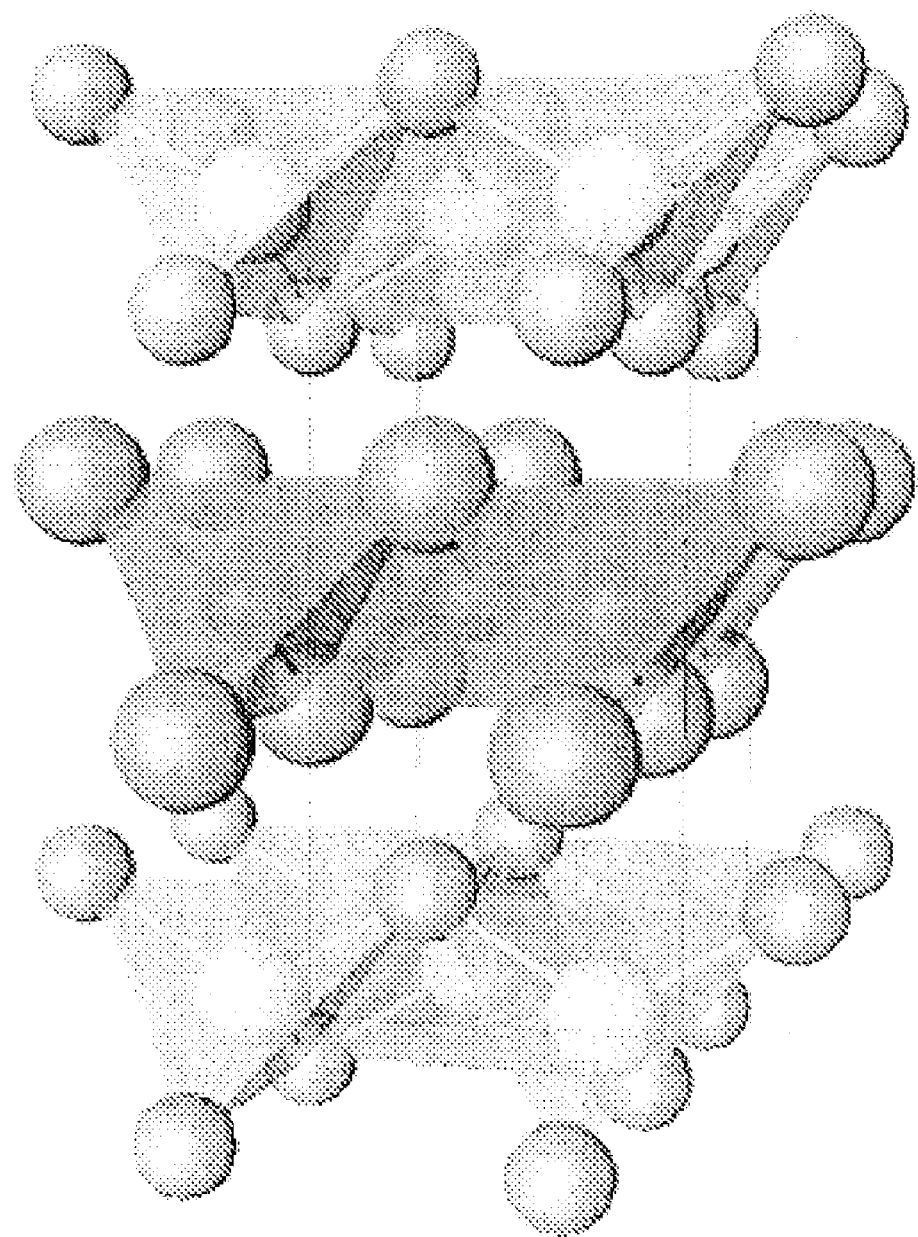
FIG. 5 depicts the structure of the iron pnictide superconductor, LaOFeAs.
Figure 6:
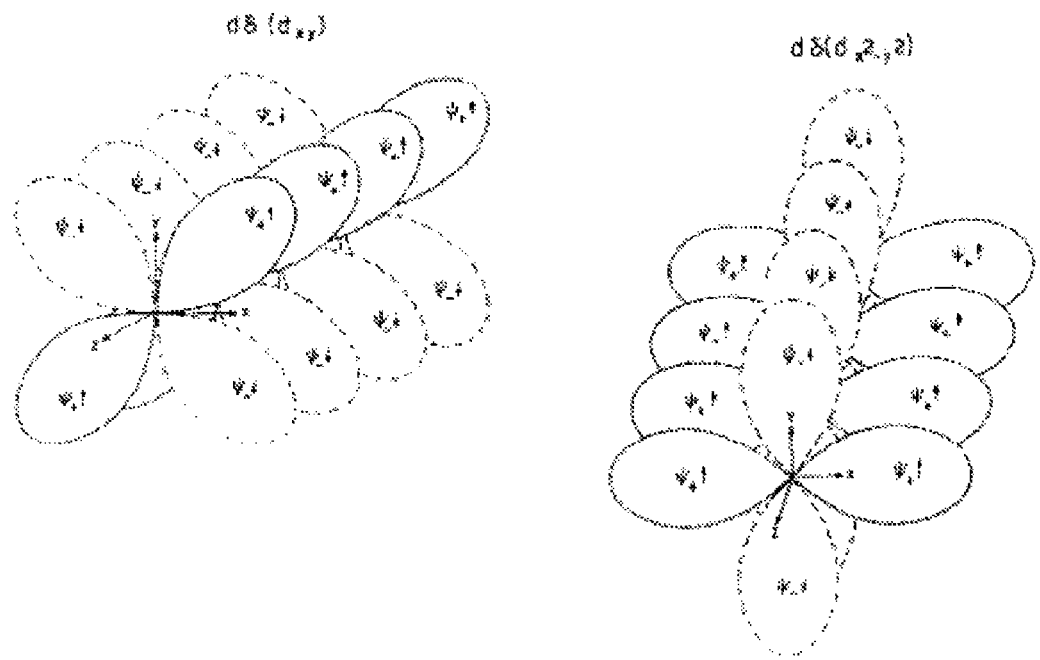
FIG. 6 illustrates "dδ-bonding" molecular orbitals, such as occur between Fe atoms at the Fermi energy of superconducting LaOFeAs.
Figure 7:
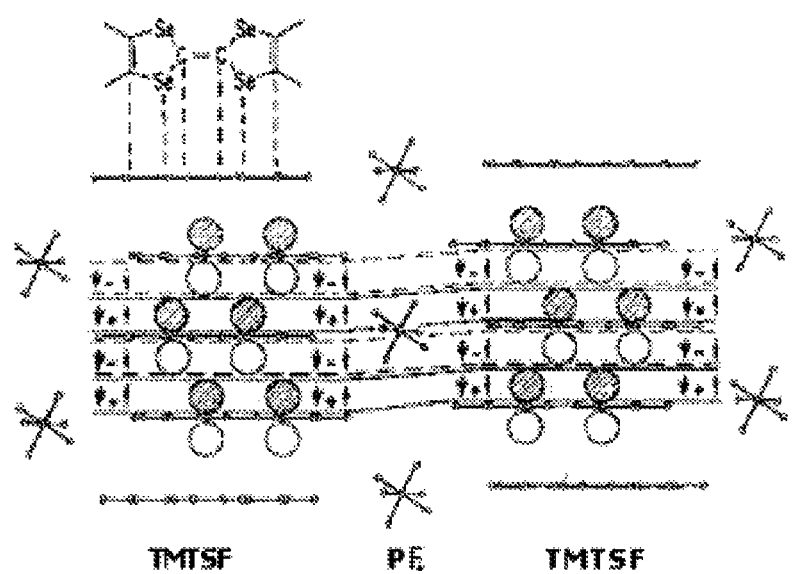
FIG. 7 represents the wave function for the molecular orbital at the Fermi energy of the organic superconductor, $(TMTSF)_2PF_6$ in relation to the crystal structure.
Figure 8:
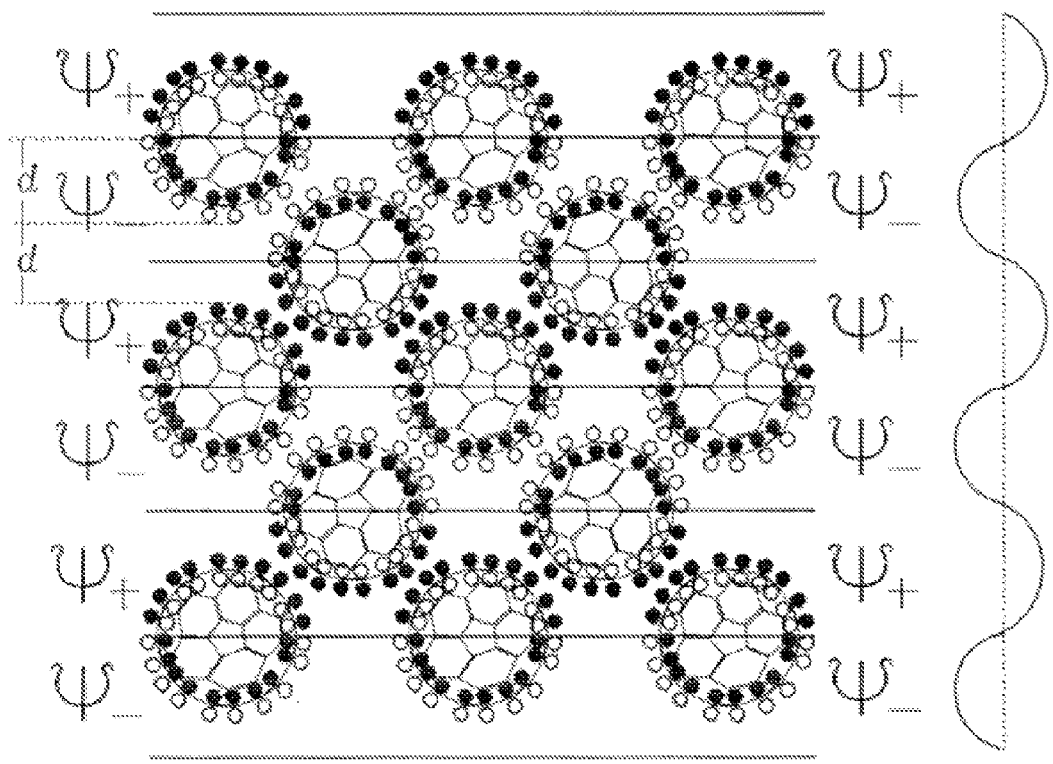
FIG. 8 depicts the wave function for the molecular orbital at the Fermi energy of an electron-doped carbon fullerene (d=5 Å) or supercooled water (d=8 Å) buckyball superconductor.

By way of introduction and without be bound to a particular theory, an understanding of superconducting compositions comprising water-cluster clathrates can be obtained from the following analysis. Based on the dynamic Jahn-Teller effect [see I. B. Bersuker and V. Z. Polinger, *Vibronic Interactions in Molecules and Crystals*, Springer-Verlag, New York, 1990], a real-space molecular-orbital description of electronic wave functions which are postulated to be the precursors of the superconducting state in high- and low-dimensional metals was proposed [see K. H. Johnson and R. P. Messmer, *Synthetic Metals* 5 (1983) 151], using the results of first-principles density-functional molecular-orbital calculations for clusters representing the local molecular environments in these materials. According to this theory, superconductivity is possible only if the normal chemical bonding system in the material or parts thereof permits the construction of degenerate molecular-orbital wave functions which, for at least one space direction, are not intersected by plane or conical nodal surfaces, and if the corresponding degenerate molecular orbitals are not fully occupied. This translates to the existence of spatially delocalized degenerate "pπ" or "dδ" molecular orbitals at the Fermi energy which are bonding within "layers" or "tubes" of opposite-phase and spin, $\Psi_+$ and $\Psi_-$, overlapping "p" or "d" atomic orbitals that span many atoms, forming a type of "electron network" at the Fermi energy, as exemplified by the high-cuprates in FIGS. 1-4, for the iron oxypnictides, in FIG. 5 and FIG. 6, for a typical organic superconductor in FIG. 7, and for an electron-doped carbon fullerene (or supercooled water—see below) buckyball superconductor in FIG. 8.

Figure 9:
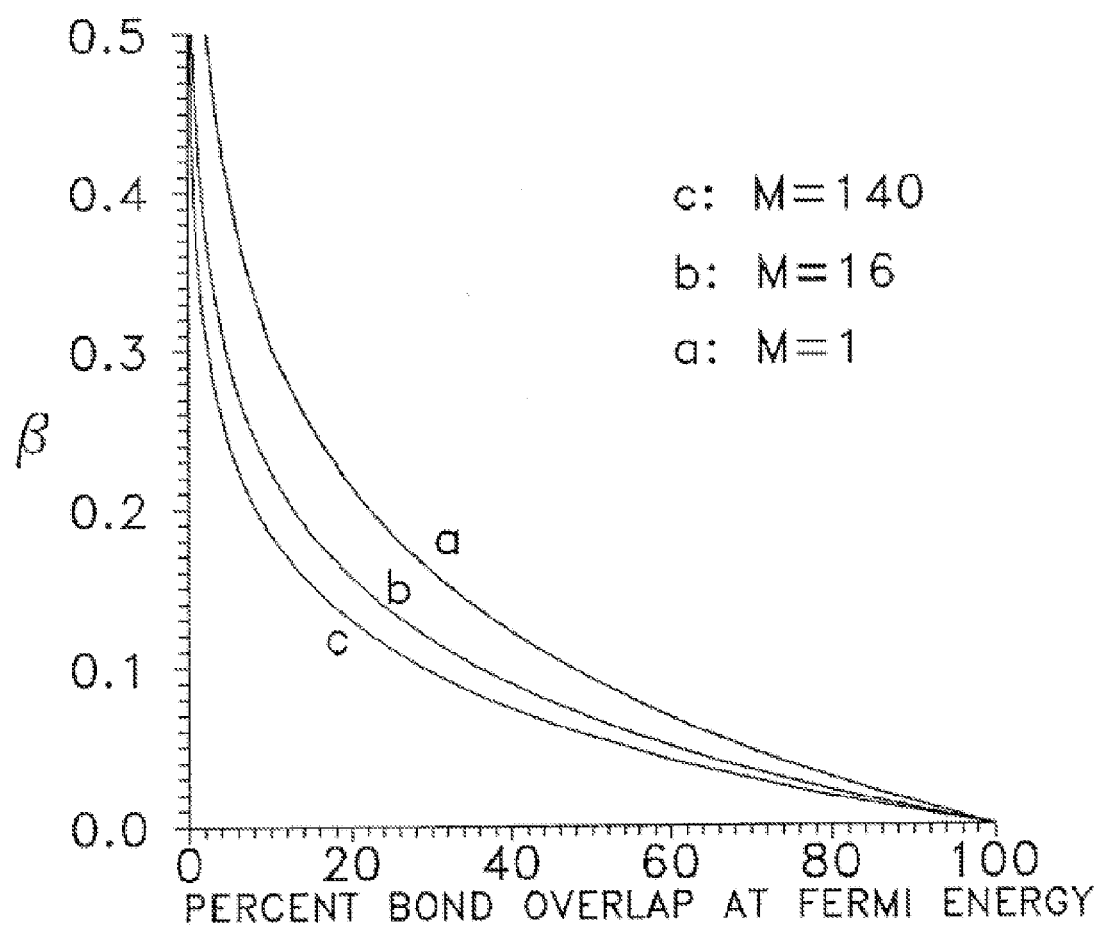
FIG. 9 is a graph of EQ. 3 for three atomic masses: M=1 (Hydrogen), M=16 (Oxygen), and M=140 (Cerium).
Figure 10A:
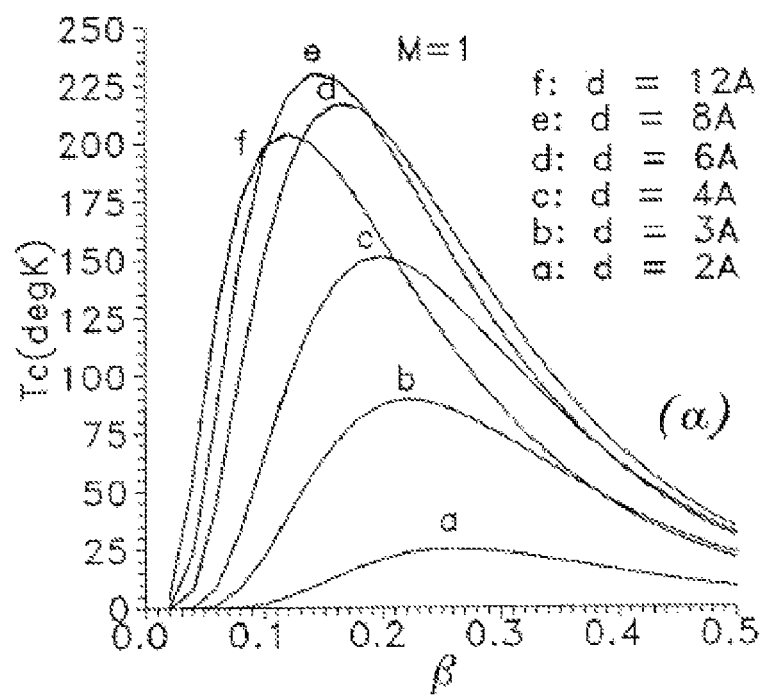
FIGS. 10A and 10B is a graph of EQ. 2 for atomic masses M=1 (Hydrogen) and M=140 (Cerium).
Figure 10B:
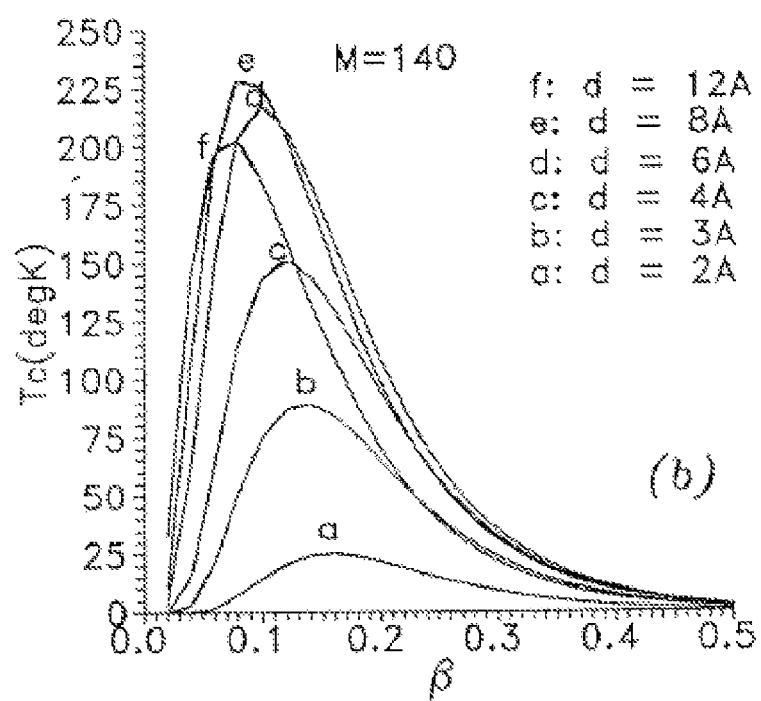
Figure 11:
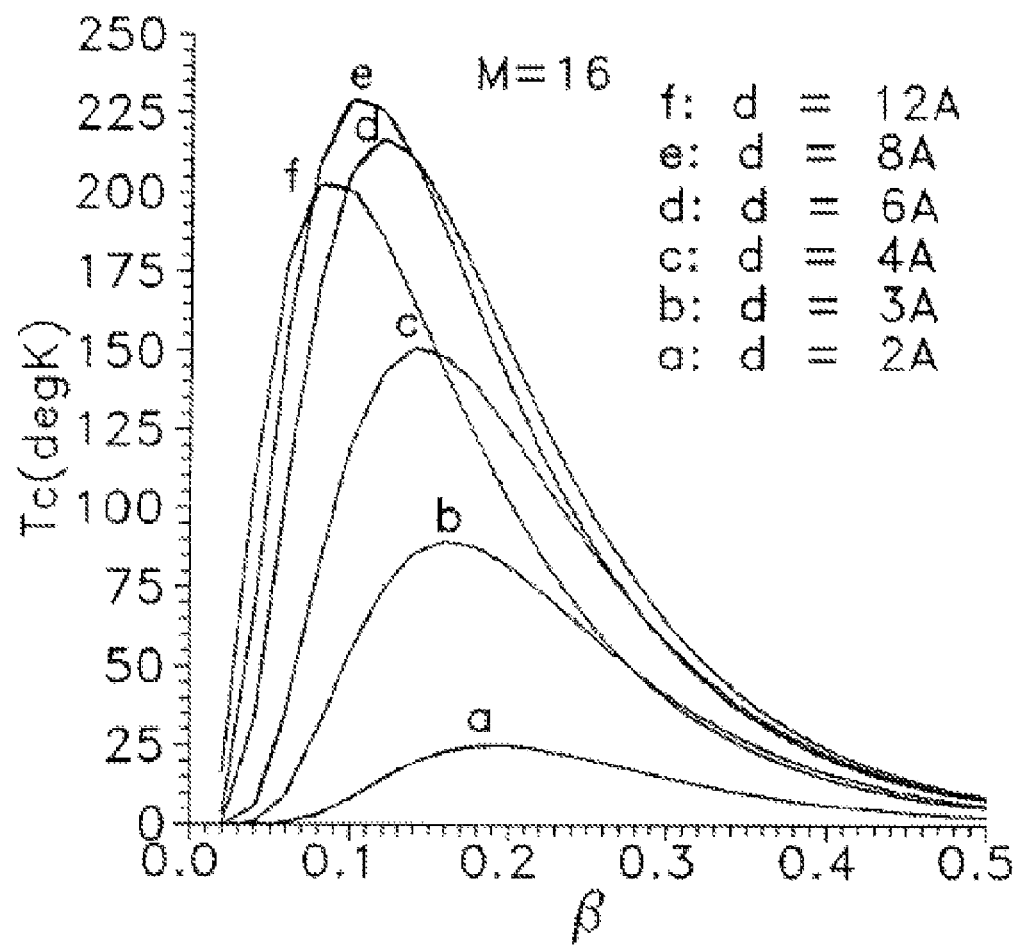
FIG. 11 is a graph of EQ. 2 for atomic mass M=16 (Oxygen).

These real-space molecular-orbital criteria for superconductivity differ from the k-space BCS theory of superconductivity in attributing Cooper pairing [see L. N. Cooper cited herein] to "anti-ferromagnetic" electron occupation of the layered or tubular degenerate "pπ" or "dδ" molecular orbitals at the Fermi energy (FIG. 3A), coupled with lattice ion vibronic displacements (FIG. 3B) induced by the dynamic Jahn-Teller effect [see I. B. Bersuker et al. and K. H. Johnson et al. cited herein], rather than to the absorption and emission of virtual phonons. The formula [see K. H. Johnson et al. cited herein]

$$Tc = \frac{h^2 \left(\frac{m}{M}\right)^\beta}{4\pi m d^2 k_B} \exp\left[\frac{-h^2}{2me^2 d\left(-\left[\frac{m}{M}\right]^\beta\right)}\right] \quad \text{EQ. 2}$$

predicts the superconducting transition temperature in terms of two simple molecular-orbital parameters: the distance d between the centroids of the "pπ" or "dδ" molecular orbitals at the Fermi energy (FIG. 3A) and the vibronic coupling parameter β determined from the orbital bond overlap at the Fermi energy according to the formula [see K. H. Johnson et al. cited herein]

$$\left(\frac{m}{M}\right)^\beta = \text{bond overlap at the Fermi energy} \quad \text{EQ. 3}$$

where m represents electron mass, M represents ion mass, h represents the Planck constant, and $k_B$ represents the Boltzmann constant. Graphs of EQ. 3 are plotted in FIG. 9 and plots of EQ. 2 are shown in FIGS. 10 and 11.

The above molecular-orbital criteria for superconductivity are diametrical to those for the occurrence of ferromagnetism, namely, the existence of spatially localized, exclusively anti-bonding (e.g., dσ*, dπ*, or dδ*) molecular orbitals at the Fermi energy. These molecular-orbital criteria therefore provide a conceptual basis for understanding the generally mutually exclusive incidence of superconductivity and magnetism among the elements of the Periodic Table, although they can also be used to explain the occasional coexistence of superconductivity and magnetism in some materials. The molecular-orbital model for superconductivity has the advantage over BCS theory in that it permits the prediction of which materials are likely to be superconductors and which are not, entirely on the basis of the molecular-orbital topology at the Fermi energy. This molecular-orbital approach can be used to explain in simple terms why some materials (e.g., Cu, Ag, and Au) are neither superconducting nor magnetic, why certain quasi-one-dimensional organic solids, such as TTF-TCNQ, are not superconductors while others, such as (TMTSF)2PF6 [FIG. 7], are superconductors, and to assess critically the likelihood of superconductivity in certain other types of substances (e.g., other types of organic solids; metallic hydrogen at attainable high pressures), and to suggest ways of systematically improving existing classes or synthesizing novel classes of superconducting materials. In certain instances, this method of analysis can be used to predict superconducting materials having very high $T_c$ values, e.g., with a predicted value of $(T_c)$max in the vicinity of 230 deg K ($T_c$ of about −43 deg C.) as implied by FIGS. 10 and 11.

In view of this analysis and in certain embodiments, supercooling of water can form water-cluster clathrates exhibiting high-$T_c$ superconductivity. Although the freezing point of liquid water is 0 deg C. (273 deg K), at standard pressure it can be supercooled to −43° C. (230 K). If rapidly supercooled, water becomes a glass and the solidification to crystalline ice can be avoided. Recent X-ray diffraction studies [see H. Yokoyama, M. Kannami, and H. Kanno, Chem. Phys. Leu. 463 (2008) 99] of supercooled water have revealed the presence of pentagonal dodecandral water-cluster clathrate structures similar to those shown in FIGS. 12 and 13. The clathrate structures can become dominant with decreasing temperature.

Figure 15:
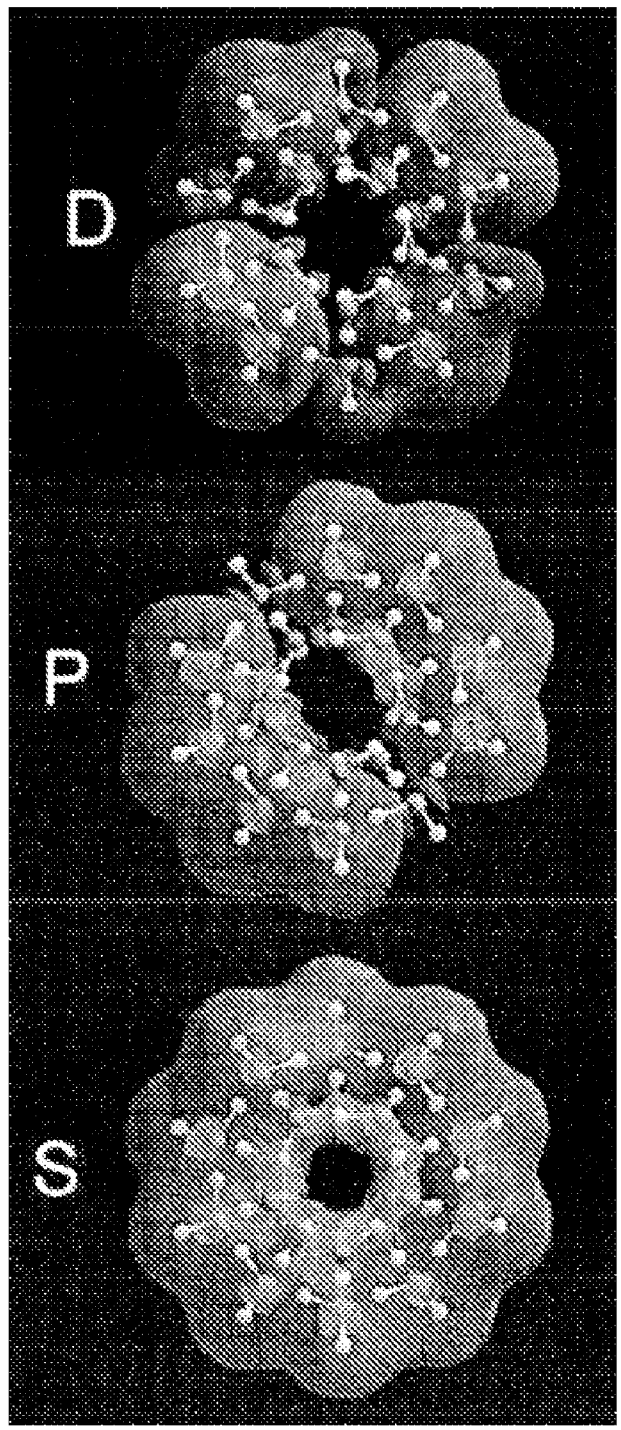
FIG. 15 displays the LUMOs of a dodecahedral water-cluster clathrate.
Figures 16A, 16B, 16C:
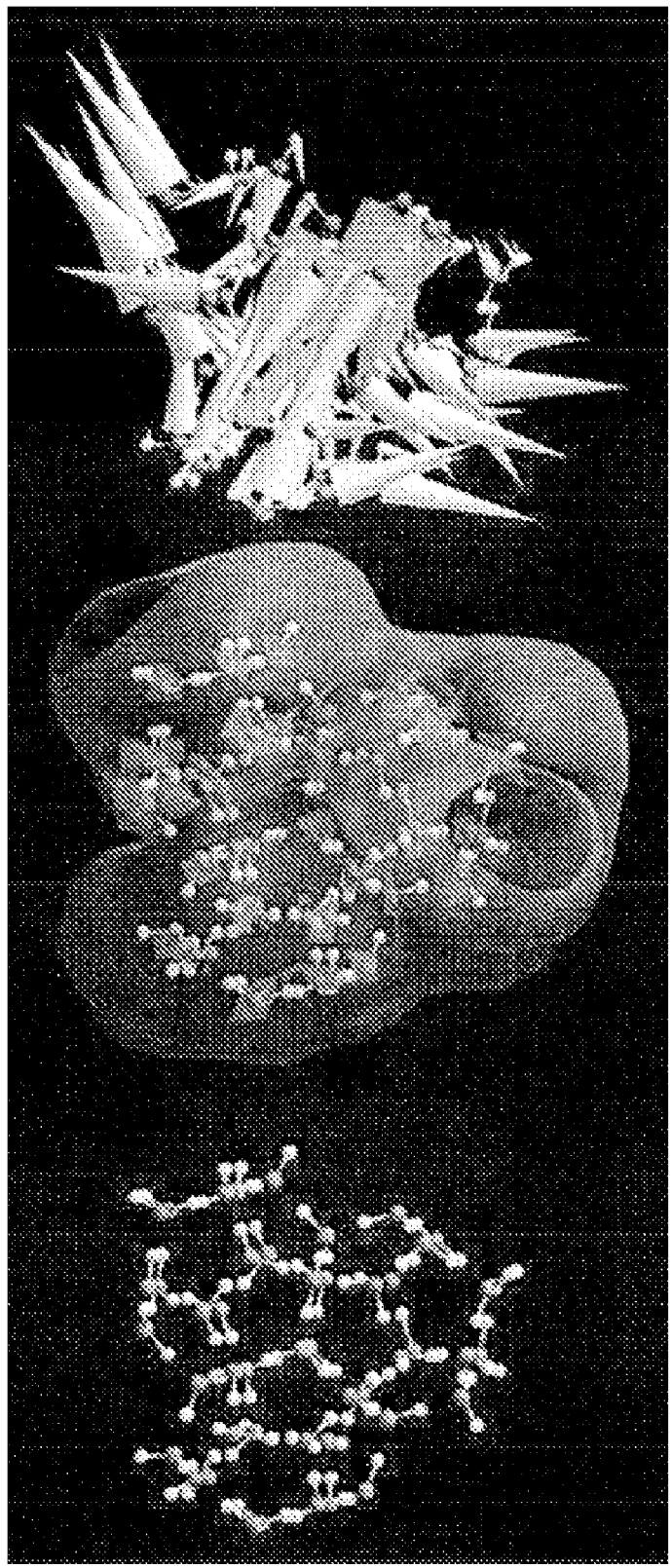
FIGS. 16A-C depict (A) the connected dodecahedral water-cluster clathrates in supercooled water; (B) a LUMO of such connected dodecahedral water-cluster clathrates in supercooled water; (C) A principal "surface" terahertz (THz) vibrational (phonon) mode of such connected dodecahedral water-cluster clathrates in supercooled water. The vectors show the directions and relative amplitudes of the vibrational mode, which is associated mainly with the collective vibrations of the cluster oxygen atoms.
Figures 17A, 17B:
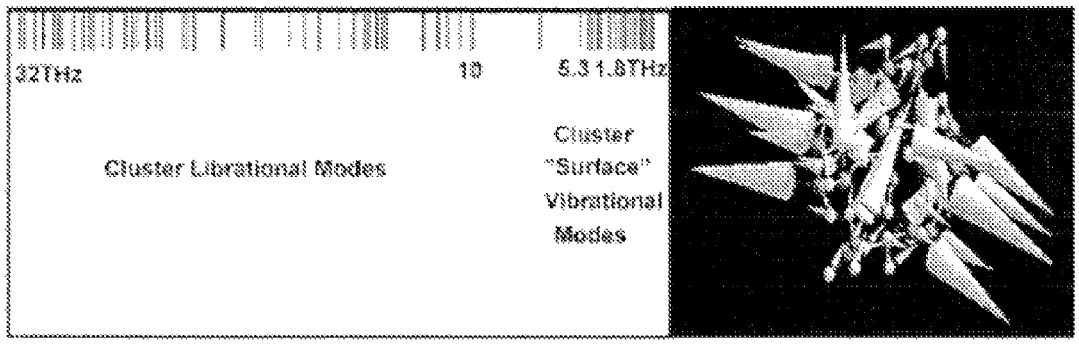
FIGS. 17A-F displays the THz vibrational modes of water-cluster clathrates comprising supercooled water as a function of increasing cluster size. The vectors show the directions and relative amplitudes of one of the lowest-frequency THz vibrational modes, which is associated mainly with the collective vibrations of the cluster oxygen atoms.
Figures 17C, 17D:
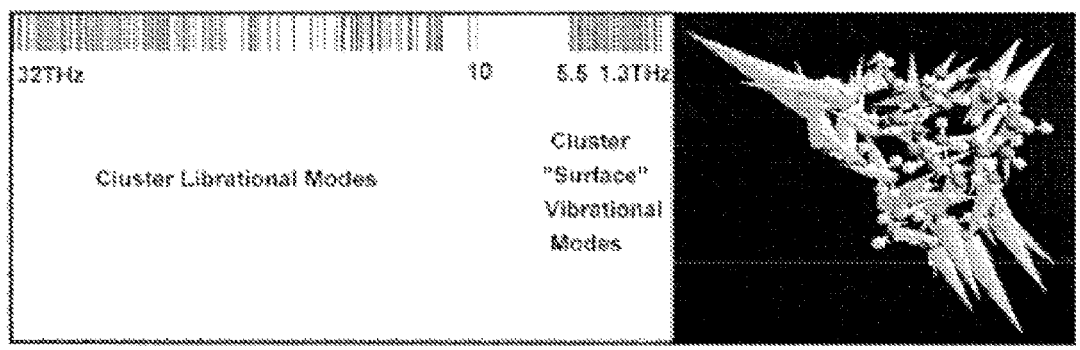
Figures 17E, 17F:
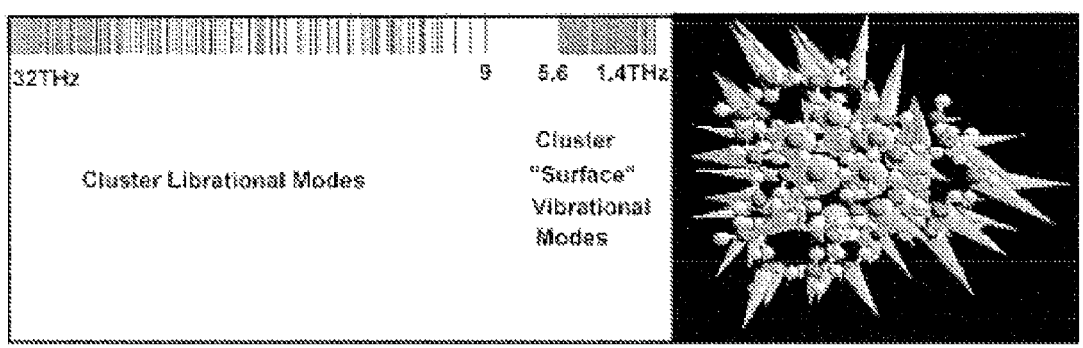
Figures 18A, 18B:
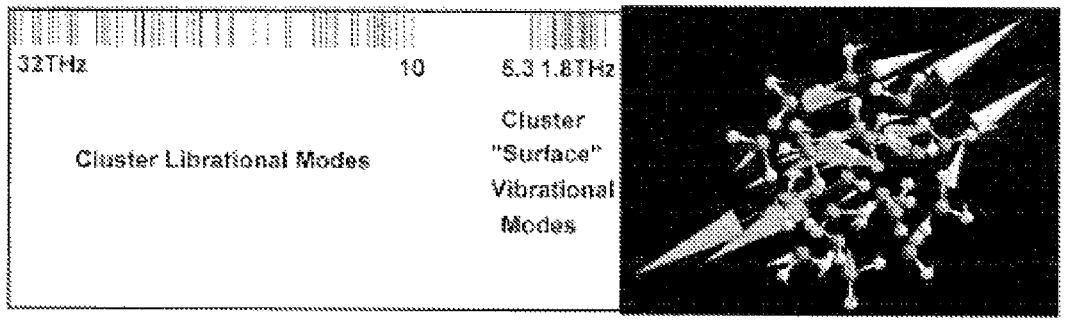
FIGS. 18A-F displays the THz vibrational modes of water-cluster clathrates containing an extra water molecule in the dodecahedral "cages" in supercooled water as a function of increasing cluster size. The vectors show the directions and relative amplitudes of one of the lowest-frequency THz vibrational modes, which is associated mainly with the collective vibrations of the cluster oxygen atoms. Note the qualitative and quantitative similarities between FIGS. 17 and 18.
Figures 18C, 18D:
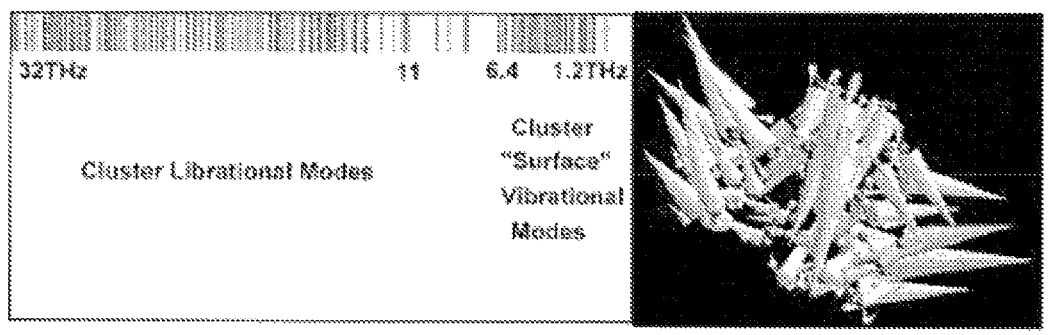
Figures 18E, 18F:
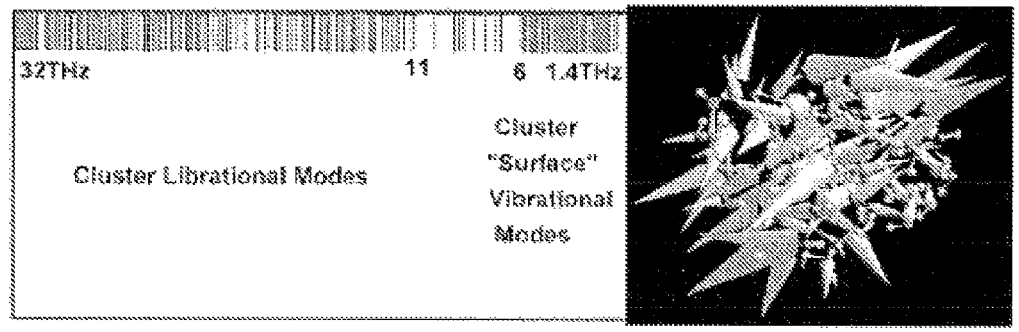

The addition of electrons to supercooled water-cluster clathrates in certain nanoemulsions, described elsewhere herein, can occupy lowest unoccupied molecular orbitals (LUMOs) of the type shown in FIGS. 14, 15, and 16B. According to the above-described molecular-orbital criterion for superconductivity [see K. H. Johnson et al. cited herein], the occupation of LUMO orbitals shown in FIGS. 14, 15, and 16B indicates that superconductivity can result at temperatures in the vicinity of −43 deg C., e.g., at temperatures within about 5 deg C. of −43 deg C., within about 10 deg C. of −43 deg C., within about 20 deg C. of −43 deg C., within about 30 deg C. of −43 deg C., and in some embodiments within about 40 deg C. of −43 deg C. According to the analysis by Johnson et al., the local phonons responsible for pairing of the added electrons and their superconductivity have a cut-off frequency of approximately 32 terahertz (THz), which is approximately the cut-off frequency of the water-cluster THz vibrations shown in FIGS. 16C, 17, and 18. Uses include magnetic and electrical applications.

Figure 19:
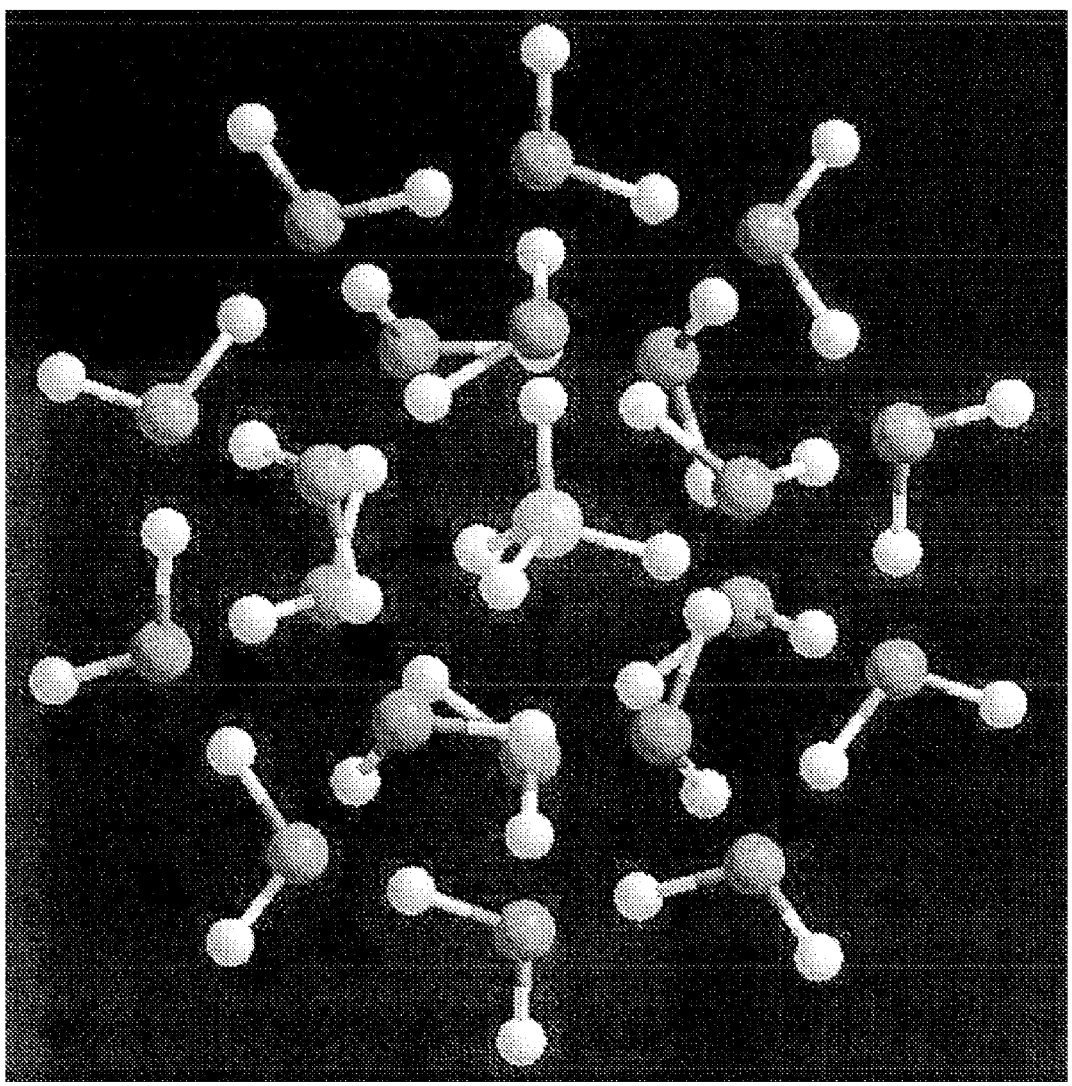
FIG. 19 depicts the pentagonal dodecahedral methane water-cluster clathrate basic to gas hydrates.

In some embodiments, gas hydrates can provide superconducting characteristics at high-$T_c$. Gas hydrates are combinations of one or more gases such as methane, natural gas, or other hydrocarbon gas molecules and water formed into a substance that looks like ice but it is unstable at standard temperature and pressure. The structure is metastable due to weak van der Waals' bonding between the gas and the water molecules and hydrogen-bonding between water molecules within the dodecahedral cage structure as depicted for methane hydrate in FIG. 19. Gas hydrates are found naturally under the ocean floor and in permafrost, but they can be produced in the laboratory under moderately high pressure or confined in nanoemulsions.

Figure 20:
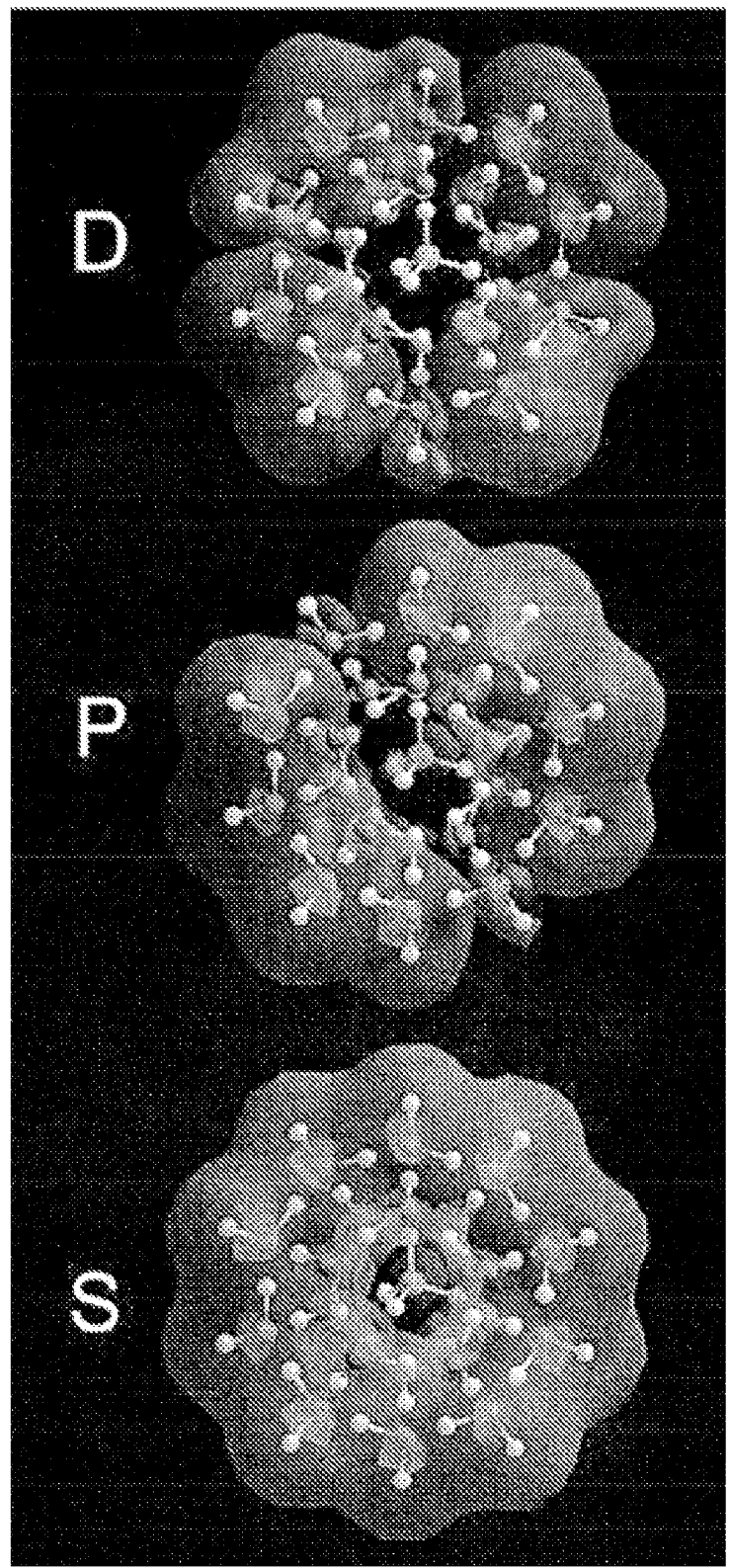
FIG. 20 displays the LUMOs of the pentagonal dodecahedral methane water-cluster clathrate basic to gas hydrates. Notice the similarity to FIG. 15.
Figure 21:
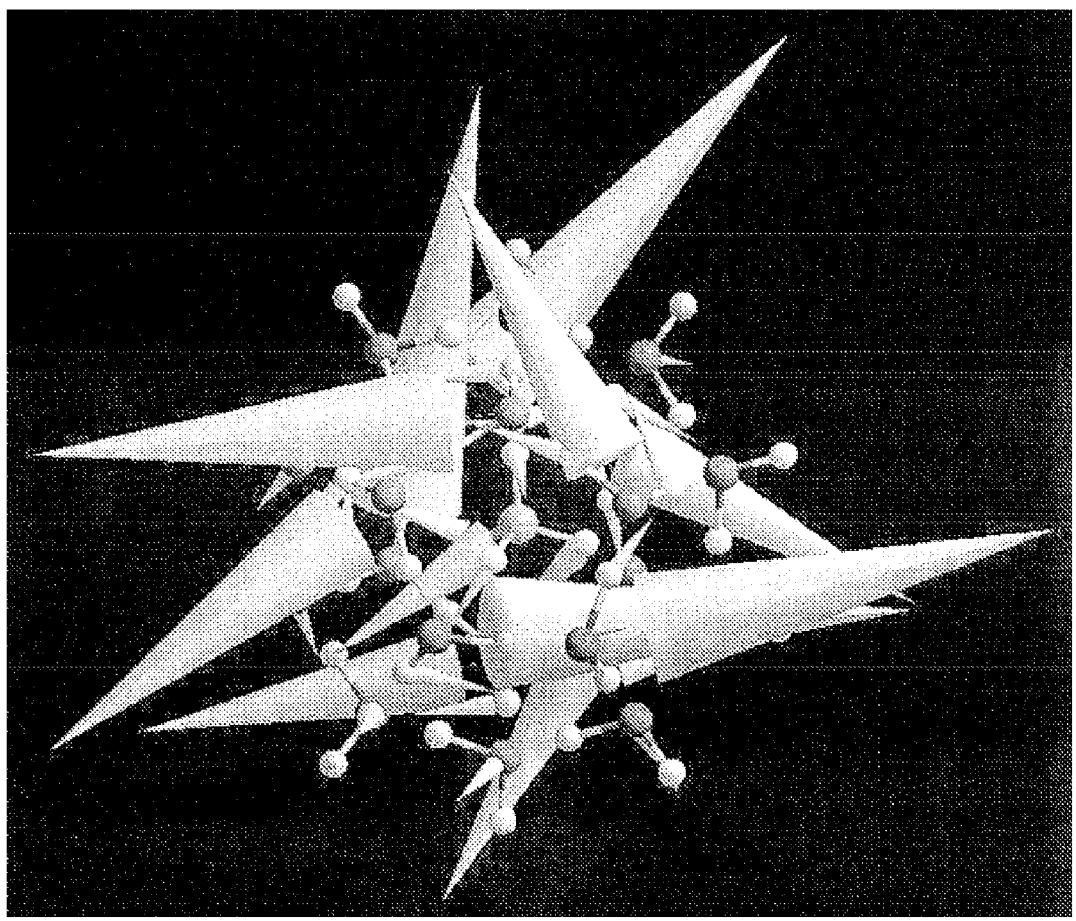
FIG. 21 depicts a low-frequency THz vibratioal mode of the pentagonal dodecahedral methane water-cluster clathrate basic to gas hydrates.

Like the example of supercooled water above, the addition of electrons to methane-water-cluster clathrates confined in specific nanoemulsions can occupy LUMO molecular orbitals of the type depicted in FIG. 20. According to the analysis by Johnson et al., the occupation of LUMO orbitals depicted in FIG. 20 indicates that superconductivity can result at temperatures in the vicinity of −43 deg C. According to the analysis by Johnson et al., the local phonons responsible for pairing of the added electrons and their superconductivity have a cut-off frequency of approximately 32 terahertz (THz), which is approximately the cut-off frequency of the methane water-cluster THz vibrations of the type shown in FIG. 21. Uses include magnetic and electrical applications.

Figures 22A, 22B, 22C:
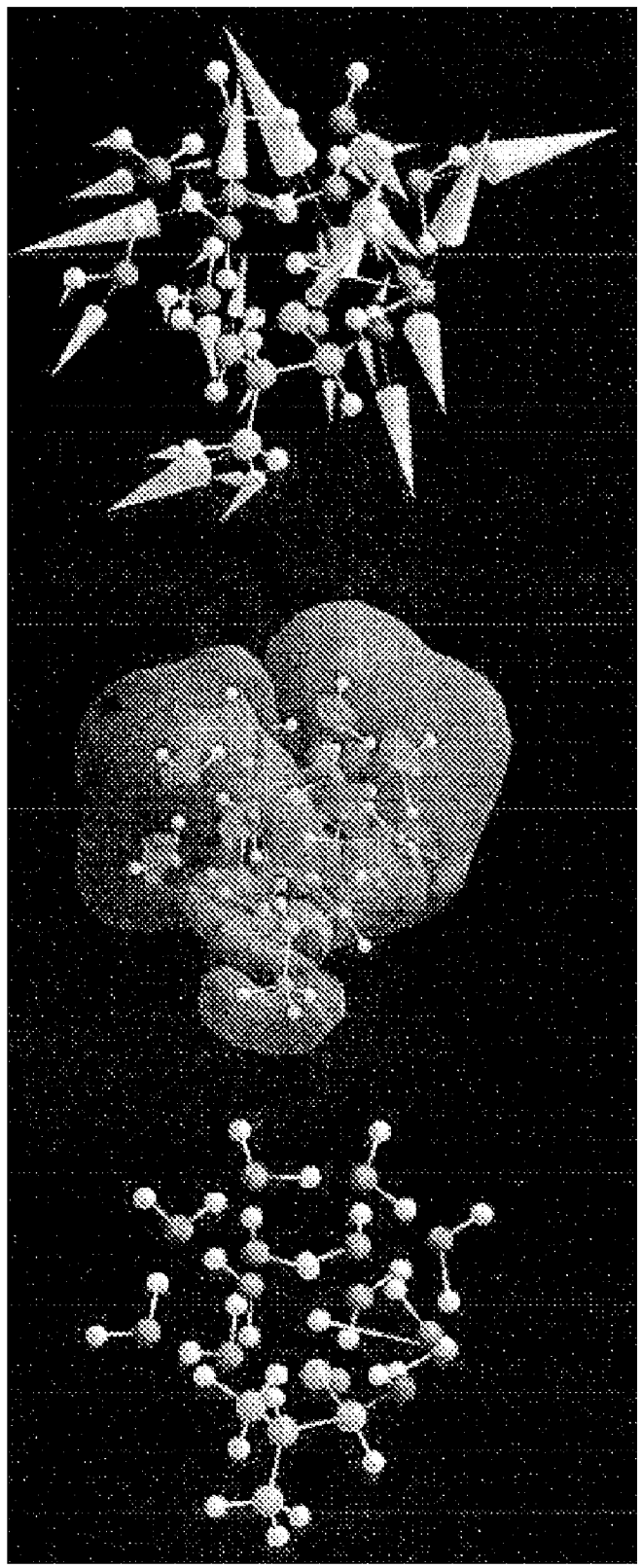
FIG. 22A depicts how a dodecahedral water-cluster "hemisphere" can cap a valyl amino acid residue in insulin. Such biological water clathrates possess LUMOs and THz vibrational (phonon) modes like those shown respectively in FIG. 22B and FIG. 22C.

In some embodiments, water clathrated in and around proteins can yield high-$T_c$ superconductivity. In certain biological systems, water can clathrate in and around proteins and be essential to their biological function, including protein folding [see M. M. Teeter, *Annu. Rev. Biophys. Biophys. Chem.* 20 (1991) 577]. An example is shown in FIG. 22A, where a dodecahedral water-cluster hemisphere caps a valyl amino acid residue in insulin [see T. Baker et al., in *Crystallography in Moecular Biology*, NATO Advanced Study Institute, Dino Moras et al. (eds.), 1985, Bischenberg, France, p. 179]. Such biological clathrates possess LUMOs and THz vibrational (phonon) modes like those shown respectively in FIGS. 22B and C. The coupling of the water-cluster THz vibrations to the THz "bending-mode" vibrations of the amino acid residue should be noted. Addition of electrons to the LUMOs (electrical charging of) such clathrates confined in proprietary nanoemulsions and lowering their temperatures to −43 deg C. can induce superconductivity as indicated by the analysis of Johnson et al. In certain embodiments, negatively-charged hydrated proteins can provide high-Tc superconductivity. Uses include magnetic and electrical applications as described elsewhere herein.

In certain embodiments, electron-doped water-cluster clathrate nanoparticles prepared from proprietary nanoemulsions provide novel high-$T_c$ superconductors. In one case, nanoemulsions have been used successfully to prepare high-$T_c$ cuprate nanoparticle superconductors. [See V. Pillai et al., *Advances in Colloid and Interface Science* 55 (1995) 241.] In some embodiments, stimulation of clathrate nanoparticle formation can be accomplished by radiating the emulsions with infrared radiation. [See T. Yokono et al., *Jap. J. Appl. Phys.* 43 (2004) L1436.] Supercooled clathrate nanoparticles precipitaed from the nanoemulsions can be dispersed in quartz capillaries or deposited on insulating substrates such as quartz or oxide on silicon to provide uniform thin-film high-$T_c$ superconductors with potentially high current densities. In some embodiments, the insulating surface comprises one or a plurality of nanotubes, a nanomaterial, e.g., a graphene membrane. The thin films can be disposed between electrically conductive contact pads for incorporation into an electronic device or integrated circuit.

In some embodiments, the water clusters are confined in nanotubes, e.g., in carbon nanotubes. In certain embodiments, the water clusters are confined in a nanomaterial membrane, e.g., a graphene membrane. In some embodiments, the nanomaterial membrane comprises a polymer incorporating buckyballs and/or nanotubes. The nanotube or nanomaterial membrane can be doped or undoped with another substance or one or more electrons. In some embodiments, the nanotube or nanomaterial membrane is doped with a donor, e.g., a material which donates one or more electrons to the lattice of the nanotube or nanomaterial membrane. The electron donating material can be a type of atom or a chemical compound incorporated with the nanotube or nanomaterial membrane.

Figures 12A, 12B, 12C:
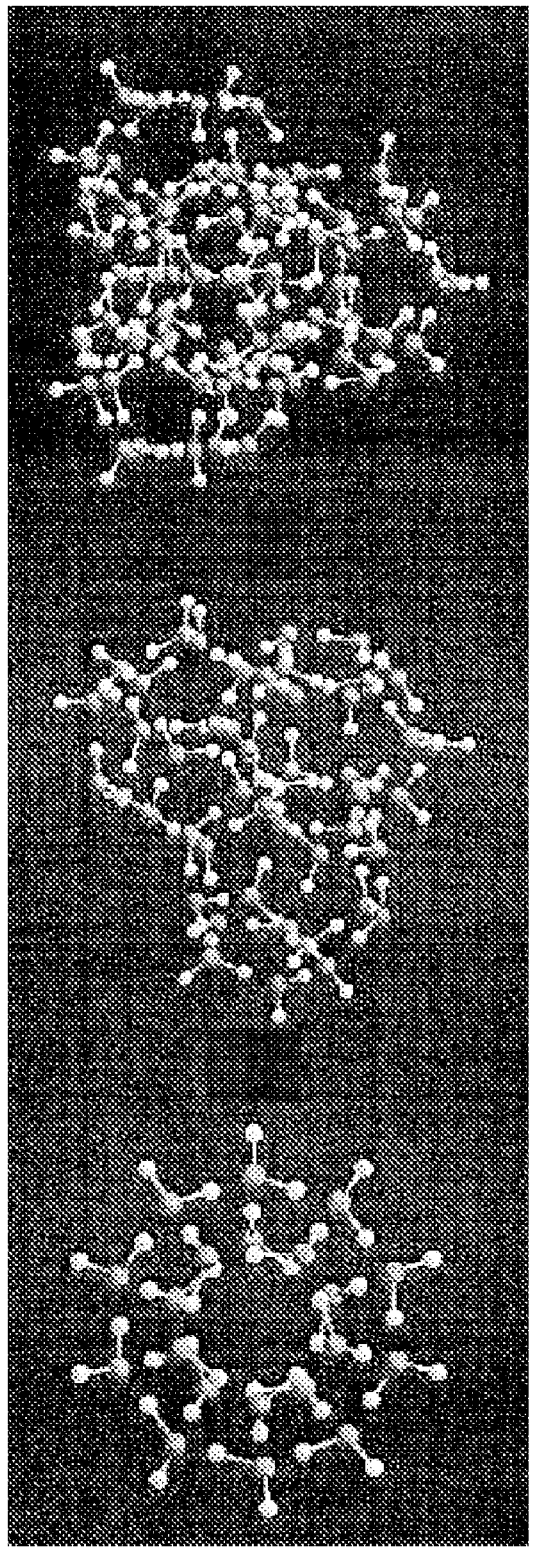
FIGS. 12A-C depicts dodecahedral water clusters of increasing size relevant to the clathrate structures of supercooled water.
Figures 13A, 13B, 13C:
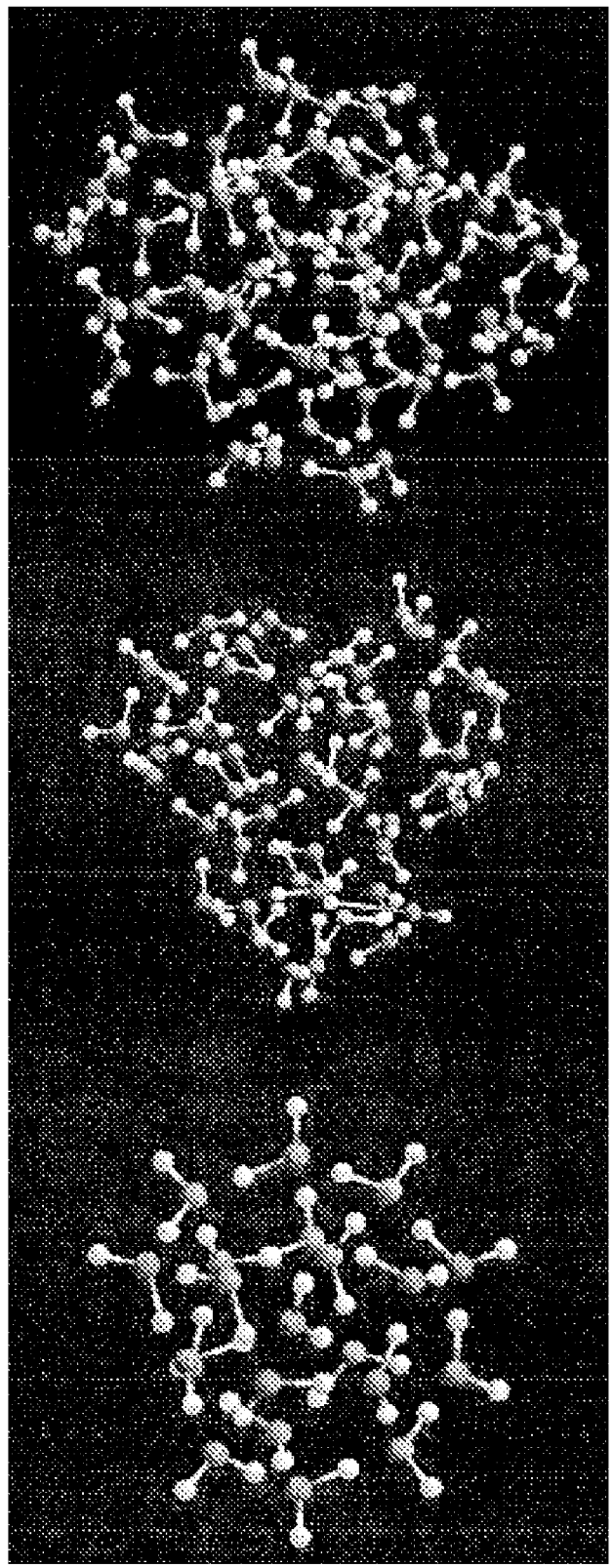
FIGS. 13A-C depicts dodecahedral water clusters of increasing size relevant to the clathrate structures of supercooled water. They are similar to those of FIG. 12, except the dodecahedral "cages" contain an additional water molecule.

In some embodiments, water-cluster clathrate nanoemulsions described in U.S. Pat. Nos. 5,800,576 and 5,997,590, both of which are incorporated herein by reference, can be used in the present invention. In certain embodiments, the water clusters are concatenated pentagonal water clusters like those shown in FIGS. 12 and 13 and are comprised of twenty or greater water molecules and having at least one dimension of 8 Å (0.8 nm) or less. For example, individual water clusters in dodecahedral form are essentially spherical in shape and have a diameter of about 0.8 nanometer (see FIG. 12A). The clathrates can be present as individual water cluster units and/or as arrays of aggregated water cluster units (FIGS. 12 and 13).

The type and size of the individual water clusters, as well as the degree and type of aggregation thereof, can vary in a given water cluster formulation of the inventive compositions. For example, a given composition of the invention can contain individual pentagonal and pentagonal dodecahedral water clusters, some of which can be in the form of multi-cluster arrays (FIGS. 12B and 12C, and FIGS. 13B and 13C).

The water nanoclusters of the present invention can be produced by a variety of means as taught in the aforesaid referenced patents (e.g., columns 9-10 of U.S. Pat. No. 5,997, 590). However, for purposes of this invention, the use of surfactants to produce the desired nanoemulsion (as described below) can be a preferred production method. The oil formulations useful for making the inventive nanoemulsions include, without being limited to, oils such as soybean, peanut, olive, sesame, paraffin, and light mineral oil.

The types of suitable surfactants include, without being limited to, fatty acids, ethoxylates and long chain alcohols. Short chain alcohols are used as cosurfactants in some embodiments. In some embodiments, the surfactant has a polar end (typically a carboxyl COOH group) which attaches itself to a water cluster. In some embodiments, the surfactant also has at least one long (preferably 6-20 carbons) linear or branched hydrophobic "tail" that is soluble in the cosmetic oil. The surfactants can be present in any amount up to about 50% by weight, e.g., between about 5% and about 10% by weight, between about 10% and about 20% by weight, between about 20% and about 30% by weight, between about 30% and about 40% by weight, and yet between about 40% and about 50% by weight. In some implementations the fatty acids include hydrolysis products of edible oils, e.g., soybean or Canola oil. These materials can consist mainly of oleic and linoleic acid. Purified cuts of these containing larger amounts of these acids can also be used. Fatty acids are examples of anionic surfactants. Ionic surfactants generally have an advantage over nonionic surfactants in being more effective in stabilizing a given amount of water. In addition, ionic surfactants can be more resistant to emulsion breaking at elevated temperature than anionic surfactants. Nonionics can maintain themselves at the interface because the polar groups (e.g., —OH) can hydrogen bond with water. However, the hydrogen bond is a weak bond (e.g., about 5 Kcal/mol) and becomes less effective as temperature rises above ambient.

Fatty acids can be effective detergents but only when at least partially neutralized. Frequently, ammonia or organic bases are used to neutralize fatty acids. Ammonia can be an effective neutralizing agent, but is a very weak base and will serve to neutralize only a fraction of the carboxylate, which is also a weak acid. Amines can be effective organic bases. Common amines are the lower alkanol amines, such as monoethanol amine (MEA), isopropanol amine and 2-butanol amine. Also common are the lower alkyl amines. There is a degree of neutralization significantly less than 100% for carboxylic acid surfactants which is optimum for solubilizing the maximum ratio of water to surfactant.

A nonionic surfactant class that can be useful for making the nanoemulsions described herein is ethoxylates. These are formed by reacting a mole of alcohol or amine with a number of moles of ethylene oxide (EO). The alcohol or amine generally contains a significant sized hydrocarbon group, for example, an alkylated phenol or a long chain alkyl group.

Alcohols frequently used in this process are nonyl phenol and lauryl alcohol. The hydrocarbon group serves as the nonpolar section of the molecule. The alcohol can have more than one —OH group and the amine more than one —H, so several ethoxy chains can be present on one molecule. However these multichain ethoxy compounds don't usually function well as surfactants because they do not easily orient at the interface and pack poorly. The balance between hydrophobicity and hydrophylicity can be obtained by choosing the hydrocarbon group and the average number of ethylene oxides added. Commonly 3-5 moles of EO are added per mole alcohol or amine.

Another class of nonionic surfactants that can be useful for making the nanoemulsions described herein is long chain alcohols. These are frequently derived from hydrogenation of fatty acids, e.g., myristyl alcohol from myristic acid. Another source can be ethylene oligomerization.

The nanoemulsions can include a "cosurfactant" (e.g., n-pentanol), which is not in itself a surfactant (i.e., a material that cannot be used as the sole surfactant, but which may be included to improve the functioning of the material which per se can be used herein as a surfactant). Use of co-solvents is theorized to lower the interfacial tension and reduce dramatically the surfactant requirement. Other co-solvents included n-butanol, n-hexanol, 2 methyl 1-pentanol, 2 methyl 1-hexanol and 2 ethyl 1-hexanol.

Figure 23:
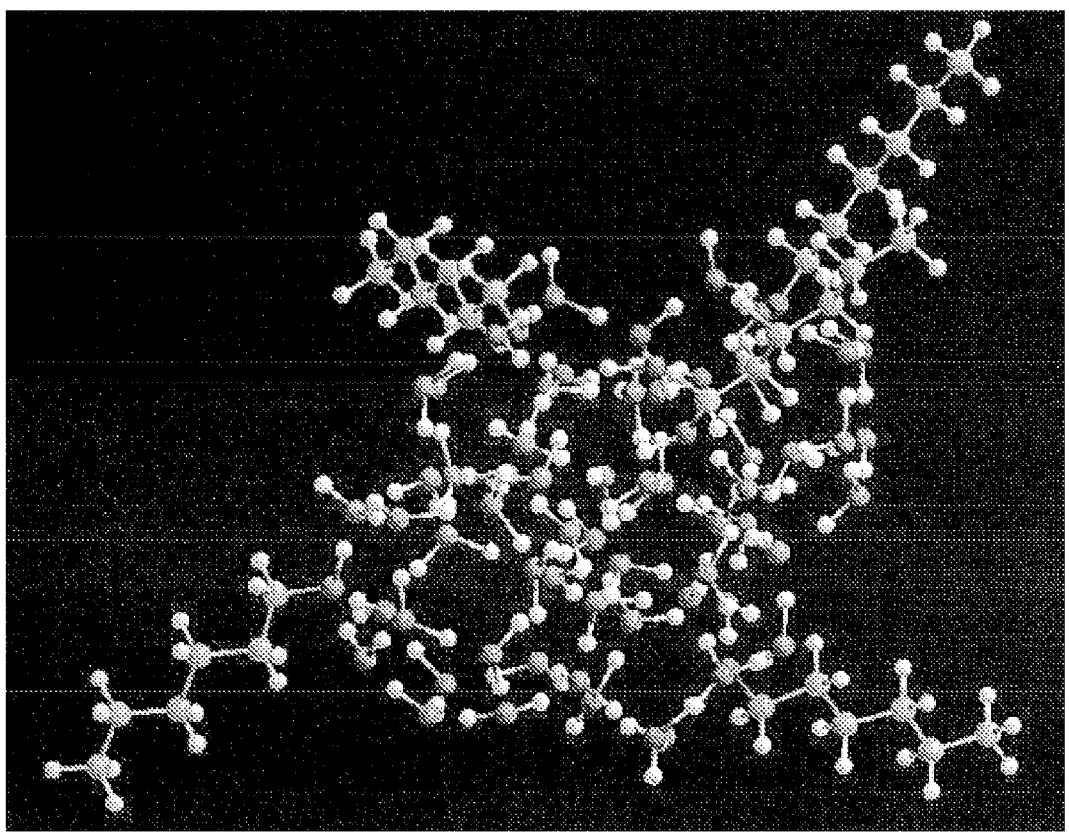
FIG. 23 displays a water-cluster clathrate array with attached surfactant molecules to stabilize the water clusters in oil to form a water-in-oil nanoemulsion.

In various embodiments, the water cluster/surfactant(s) is present in the oil as a water-in-oil (W/O) emulsion. The W/O emulsions can be comprised of the water clusters (individual or arrays thereof in the forms, shapes and dimensions described above) with surfactants molecules attached thereto, as shown in FIG. 23.

Concentrations of water by weight can be any value in a range of about 5-50% with the surfactant concentration (typically one surfactant molecule per water cluster) chosen to maximize the presence of water clusters with sizes between about 0.5 and 10 nanometers (about 5-100Å). In some embodiments, the concentration of water is between about 5% and about 10% by weight, between about 10% and about 20% by weight, between about 20% and about 30% by weight, between about 30% and about 40% by weight, and yet between about 40% and about 50% by weight. In some embodiments, the concentration of water can be higher than the concentration of surfactant. In some embodiments, the concentration of surfactant can be higher than the concentration of water. In some embodiments, the nanoemulsions are filtered and/or centrifuged to extract a portion of the sample having a majority of water clusters with sizes between about 0.5 and 10 nanometers.

Although a variety of surfactants are noted in the preparation of nanoemulsions discussed in U.S. Pat. Nos. 5,800,576 and 5,997,590 and suitably form nanoemulsions with the diesel oils and other fuel oils for the combustion-related uses therein, such surfactants may not necessarily form the stable water nanocluster compositions of the oils in the present invention (because of the inherent differences in these types of oils) and/or the hazardous properties of these oils.

Figure 25A:
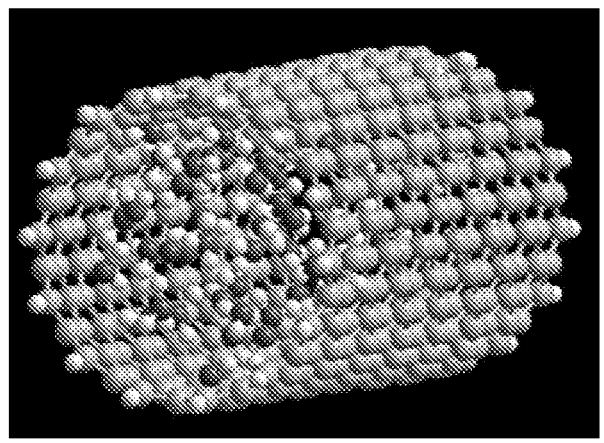
FIG. 25A depicts water clusters confined in a carbon nanotube.
Figure 25B:
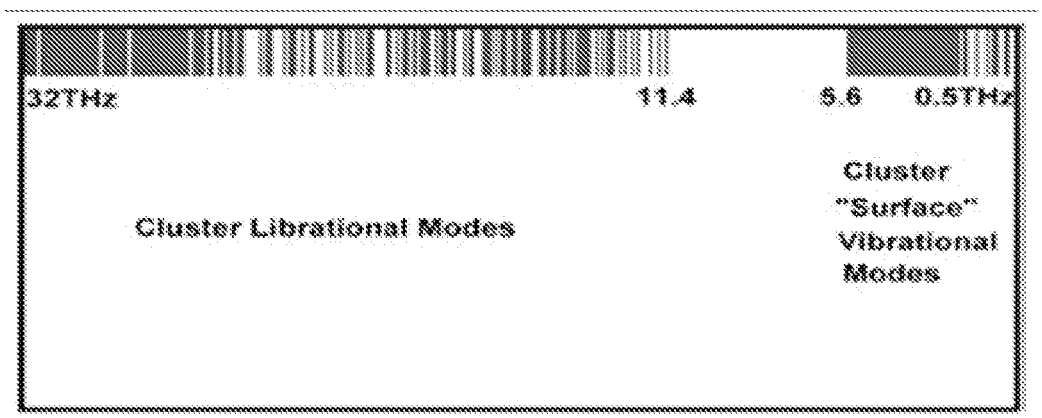
FIG. 25B represents a bar graph of vibrational spectra of various modes of the nanotube-confined water clusters of FIG. 25A.

The inventors have also discovered that water can form stable nanoclusters inside nanotubes, e.g., inside carbon or titanium oxide nanotubes. First-principles quantum-chemistry calculations for water confined in carbon nanotubes have been carried out. The analysis indicates that stable water-nanocluster configurations such as that depicted in FIG. 25A can be produced having vibrational spectra like that estimated in FIG. 25B. The 1-6 THz water-cluster vibrational modes underlie nanofluidic flow and can greatly influence the electronic and other physical properties of the nanotubes. In certain embodiments, a composition comprising water clusters confined in one or plural nanotubes is disposed on a substrate, e.g., a quartz or insulator-on-silicon substrate. The composition is cooled to a temperature at or below which the composition exhibits superconductivity. In some embodiments, the composition is provided by supercooling a mixture comprising water and nanotubes. The mixture can be in the form of an emulsion in some embodiments. It will be appreciated that the confined water cluster nanotube can act as a superconducting wire.

According to the analysis of superconductivity described herein, the water-cluster clathrate nanoparticles prepared from the nanoemulsions described above are indicated to exhibit superconductivity at temperatures in the vicinity of about −43 deg C. or lower after supercooling.

Supercooling can be accomplished with commercial refrigerator apparatus or liquid nitrogen, whereupon the prepared nanoemulsions are immersed in the coolant environment and cooled at a rate of approximately −1.5 deg K per minute to about −43 deg C. and lower. The onset of super conductivity can be test for using several experimental procedures. The most practical test for superconductivity is the Meissner effect, namely the expulsion of a magnetic field at the transition temperature $T_c$. The expulsion of magnetic field can be detected as diamagnetism using a commercial SQUID (Superconducting Quantum Interference Device) magnetometer.

Cooling of the inventive superconducting compositions can be performed by any number of means to achieve temperatures below about −20 deg C. In some embodiments, thermoelectric or Peltier coolers can be placed in thermal contact with a substrate or quartz tube on which, or in which, a superconducting composition is disposed. In some embodiments, liquid-nitrogen-based or liquid-helium-based cooling systems can be used to lower or supercool the superconducting compositions.

There exist a number of electronic and magnetic applications for which the inventive superconducting compositions can be used. The compositions can be used to make Josephson junctions that are the basis of SQUID devices. A conventional superconducting material for SQUIDs is niobium, and an entire device having a niobium superconductor needs to operate within a few degrees of absolute zero, cooled with liquid helium. Cooling to liquid helium temperatures can be difficult and expensive. Superconducting clathrate nanoparticles prepared from nanoemulsions of the types described above can allow the production of high-$T_c$ SQUIDS, with superconductivity maintained by relatively inexpensive liquid nitrogen (compared to liquid helium).

The extreme sensitivity of SQUIDs makes them highly attractive for studies in biology. For example, magnetoencephalography uses an array of SQUIDs to study neural activity inside the brains. SQUIDs are also used in magnetogastrography—the study of weak magnetic fields of the stomach. SQUIDs are also used to trace the path of orally applied drugs. The current widest use of SQUIDs is for sensitive measurements of the magnetic properties of materials. The inventive compositions could allow the production of commercial turn-key SQUID-based instruments operating at more easily attainable $T_c$ values.

SQUIDS based on superconducting nanoemulsions could also be used as detectors in Magnetic Resonance Imaging (MRI). SQUID-detected MRI has advantages over high field MRI systems such as a reduction in cost required to build such a system and a reduction in size of the MRI system.

Other applications include a scanning SQUID microscope, oil prospecting, sensors for mineral exploration, earthquake prediction, and geothermal energy surveying. Uniform dispersal of supercooled, electron-doped, clathrate nanoparticles in insulating capillaries or on substrates such as quartz may lead to high current-carrying, high-$T_c$ superconductor "water-wires" for electrical transmission purposes. In some embodiments, nanotube-confined water-cluster superconducting wires can be disposed in an integrated circuit. Finally, SQUID devices based on water-cluster superconductors could also be used as precision movement sensors in a variety of scientific applications, such as the detection of gravitational waves.

EXAMPLES

Figure 24:
FIG. 24 shows laboratory samples of water-in-oil nanoemulsions containing stabilized water clusters.

Several examples of nanoemulsions comprising water-cluster clathrates are provided. In certain embodiments, the nanoemulsions can be cooled via supercooling to provide superconducting compositions. FIG. 24 shows some laboratory samples of the nanoemulsions described herein.

Example 1

A water-nanocluster/oil formulation is prepared by mixing the following ingredients to make 1 Kg of formulation: Component Weight Percent—Soybean Oil ~50%; Water ~25%; Surfactant I ~20%; Surfactant II ~4%; and Surfactant III ~1%. The water is negatively charged using a commercial ionizer, e.g., using a Jupiter water ionizer available through www.jupiterionizers.com. Surfactant I is an ethoxylate. Surfactant II is a polyglyceryl-oleate. Surfactant III (a cosurfactant) is n-pentanol. The nanoemulsions are prepared by mixing the soybean oil with Surfactants I and II. Water and Surfactant III are then added simultaneously. The resultant water-nanocluster/oil formulation is a W/O emulsion, with a significant population of stable water clathrates. Surfactant I is a partially (80%) neutralized (with isopropanol amine) soybean fatty acid. Surfactant II is an ethoxylate. Surfactant III (a cosurfactant) is n-pentanol. The nanoemulsions are prepared by mixing the soybean oil with Surfactants I and II. Water and Surfactant III are then added.

Example 2

A soybean oil in which the water is not in the form of nanosized micelles is made as follows: Component Weight Percent—Soybean Oil ~73%; Water ~25%; Surfactant I ~1%; and Surfactant II ~3%. The water is electron-doped (negatively charged) using a commercial ionizer. Surfactant I is a polyglycerylleate. Surfactant II (a cosurfactant) is n-pentanol. The nanoemulsion is prepared by mixing the soybean oil with Surfactant I. Water and Surfactant II are then added simultaneously.

Three grams of the formulation of Example 2 are placed on a watch glass and this watch glass is placed on a scale. Three grams of the formulation of Example 1 are placed on another watch glass on another scale. Weight losses for each are shown in Table I.

TABLE i

| time (hr) | Example 1 weight loss (mg) | Example 2 weight loss (mg) |
|---|---|---|
| 1 | 28 | 122 |
| 2 | 62 | 226 |
| 3 | 83 | 307 |

The water nanoclusters of the formulations of Examples 1 and 2 were found to be in a size range of about 2-10 nm with some smaller than 2 nm, as determined by dynamic light scattering and Raman spectroscopy. Raman spectroscopy could identify water clusters below 2 nm through their well defined vibrational spectra.

Example 3

Another formulation was made as follows: Component Weight Percent—Soybean Oil ~50%; Water ~25%; Surfactant I ~12%; Surfactant II ~12%; and Surfactant III ~1%. The water was negatively charged using a commercial ionizer. Surfactant I is an ethoxylate. Surfactant II is a partially (50-80%) neutralized (with isopropanol amine) soybean fatty acid. Surfactant III (a cosurfactant) is n-pentanol. The nanoemulsions are prepared by mixing the soybean oil with Surfactants I and II. Water and Surfactant III are then added simultaneously.

Example 4

Another nanoemulsion formulation is formed from the following ingredients: Component Weight Percent—Soybean Oil ~50%; Water ~25%; Surfactant I ~20%; Surfactant II ~4%; and Surfactant III ~1%. In various embodiments, the water-nanocluster compositions of the present invention are stable (i.e.; they are thermodynamically stable) in the form of water-in-oil (W/O) nanocluster emulsion for extended periods, most preferably, for months or years after they are formulated). Although an oil and water emulsion can be made by various mixing techniques and/or through the use of other surfactants, such emulsions are typically either oil-in-water (O/W) emulsions (i.e.; not W/O emulsions) and/or are not stable (e.g.; significant phase separation occurs immediately or within hours or several days after preparation). In accordance with the present invention, highly stable (e.g.; which remain stable for 24-36 months) water-in-oil nanocluster emulsions can be provided through the use of surfactants selected from the group consisting of fatty acid and fatty acid amides, most particularly when the oils and the surfactant are mixed prior to the addition of the water.

As discussed hereinabove, in some embodiments the surfactant has a polar end (typically a carboxyl COOH group) which attaches itself to a water cluster and the surfactant also has at least one long (preferably 6-20 carbons) linear or branched hydrophobic "tail" that is soluble in the oil. Fatty acid amides can be used including the simple fatty acid amides (having the formula R—CO—NH2), which result from the replacement of the hydroxyl of the carboxyl group with an amino group and fatty acid allcanolamides, typically derived from fatty acids (e.g.; coconut oil) and alkanolamines Among the more preferred fatty acid amides are Tallamide diethanolamine (DEA) and Cocamide DEA obtainable from McIntyre Group, Ltd., University Park, 11.60466, under the trade names Mackamide TD and Mackamide C-5, respectively. These surfactants, when used in the preparation of water-nanocluster compositions of this invention, by mixing mineral oil and the surfactant prior to the addition of the water, form water-in-oil nanocluster emulsion which remain stable for extended periods of time.

Additional materials such as PPG-3 Myristyl Ether, can also be used to enhance the mixing of the surfactant and the oil. However, the order of mixing (e.g., mixing the cosmetic oil and surfactant prior to the addition of the water components) can be important in obtaining a desired nanoemulsion.

Example 5

Another water-nanocluster compositions of the present invention is prepared by mixing the following ingredients in the specified approximate weight percentages: Mineral Oil ~65.8%; Tallamide DEA ~11.3%; and Distilled Water ~22.9%. The mixing procedure involves adding the components in the order indicated above, with the oil/surfactant components premixed with a little stirring prior to the addition of the distilled water. Thick whitish tendrils are formed as the water is added drop wise into the oil/surfactant mixture. After a little stirring and a few seconds time, the final blend clarifies, indicative of the formation of a water-in-oil (W/O) nanoemulsion. The formulation at this point is a pale yellowish liquid of medium viscosity, with a very slight haze. This product remains a stable nanoemulsion for over 36 months.

Dynamic light-scattering measurements of the nanoemulsions indicate water-micelles between one and six nanometers (10-60 Angstroms) in diameter. Adding more water to the above mixture to a total of approximately 30% water, the mixture becomes whitish, with a tendency to thicken over time.

Example 6

Another water-nanocluster composition of the present invention is prepared by the same procedure as in Example 5, except that a mixture of Tallamide DEA and Cocamide DEA is used as the surfactants, with the percentages being ~8.0% wgt and ~3.3% wgt respectively, instead of using ~11.3% wgt of Tallamide DEA alone. A water-in-oil (W/O) nanoemulsion, which is substantially identical to that of Example 5, is formed and has substantially identical properties and characteristics.

All literature and similar material cited in this application, including, but not limited to, patents, patent applications, articles, books, treatises, and web pages, regardless of the format of such literature and similar materials, are expressly incorporated by reference in their entirety. In the event that one or more of the incorporated literature and similar materials differs from or contradicts this application, including but not limited to defined terms, term usage, described techniques, or the like, this application controls.

The section headings used herein are for organizational purposes only and are not to be construed as limiting the subject matter described in any way.

While the present teachings have been described in conjunction with various embodiments and examples, it is not intended that the present teachings be limited to such embodiments or examples. On the contrary, the present teachings encompass various alternatives, modifications, and equivalents, as will be appreciated by those of skill in the art.

The claims should not be read as limited to the described order or elements unless stated to that effect. It should be understood that various changes in form and detail may be made by one of ordinary skill in the art without departing from the spirit and scope of the appended claims. All embodiments that come within the spirit and scope of the following claims and equivalents thereto are claimed.

What is claimed is:

1. An apparatus comprising:
    a composition comprising water clusters disposed on an insulating surface, wherein
    the water clusters are cooled to a temperature such that the composition is superconducting.

2. The apparatus of claim 1, wherein the composition is provided from a water-in-oil nanoemulsion.

3. The apparatus of claim 1, wherein the water clusters are electron doped.

4. The apparatus of claim 1, wherein the water clusters are confined in nanotubes.

5. The apparatus of claim 4, wherein the nanotube is doped with electron donating material.

6. The apparatus of claim 1, wherein the water clusters are confined within a nanomaterial membrane.

7. The apparatus of claim 6, wherein the nanomaterial membrane is doped with electron donating material.

8. The apparatus of claim 1, wherein the composition is cooled to a temperature between about −23 deg C. and about −63 deg C.

9. The apparatus of claim 1, wherein the composition has been supercooled.

10. The apparatus of claim 1 further comprising one or more electrical contact pads disposed on the substrate in electrical contact with the composition.

11. The apparatus of claim 10 further configured to flow electrical current through the composition via the one or more electrical contact pads.

12. The apparatus of claim 1 incorporated in a superconducting quantum interference detector.

13. The apparatus of claim 1, wherein the water clusters are clathrated to a protein.

14. The apparatus of claim 1, wherein the water clusters hydrate a gas.

* * * * *